United States Patent
Momota

(10) Patent No.: US 7,022,456 B2
(45) Date of Patent: Apr. 4, 2006

(54) POSITIVE PHOTORESIST COMPOSITION

(75) Inventor: Makoto Momota, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 12 days.

(21) Appl. No.: 10/642,576

(22) Filed: Aug. 19, 2003

(65) Prior Publication Data

US 2004/0048190 A1   Mar. 11, 2004

(30) Foreign Application Priority Data

Aug. 22, 2002   (JP)   ............ P. 2002-241946

(51) Int. Cl.
*G03C 1/73*   (2006.01)
*G03F 7/039*   (2006.01)
*G03F 7/20*   (2006.01)
*G03F 7/30*   (2006.01)

(52) U.S. Cl. .................. 430/270.1; 430/326; 430/905; 430/907; 430/910; 430/919; 430/921; 430/286.1

(58) Field of Classification Search ............. 430/270.1, 430/286.1, 905, 907, 322, 913

See application file for complete search history.

(56) References Cited

U.S. PATENT DOCUMENTS 5,800,964 A * 9/1998 Sato et al. ................ 430/281.1

FOREIGN PATENT DOCUMENTS

| JP | 7-21626 B2 | 3/1995 |
| JP | 7-230165 A | 8/1995 |
| JP | 10-139747 | * 5/1998 |
| JP | 2000-162768 A | 6/2000 |

OTHER PUBLICATIONS

Machine-assisted English translation of JP 10-139747, provided by JPO.*

* cited by examiner

*Primary Examiner*—Sin Lee
(74) *Attorney, Agent, or Firm*—Sughrue Mion, PLLC

(57) ABSTRACT

A positive photoresist composition comprising:
(A) an oxime sulfonate compound represented by the specific formula,
(B) a resin comprising repeating units including a group represented by the specific formula and which increases the solubility in an alkaline developing solution by the action of an acid, and
(C) a fluoroaliphatic-group-containing polymeric compound containing repeating units derived from a monomer represented by the specific formula.

8 Claims, No Drawings

POSITIVE PHOTORESIST COMPOSITION

FIELD OF THE INVENTION

The present invention relates to a positive photoresist composition for use in producing semiconductor integrated-circuit elements, masks for integrated circuit production, printed wiring boards, liquid-crystal panels, or the like.

BACKGROUND OF THE INVENTION

Chemical amplification type positive resist compositions are pattern-forming materials which, when irradiated with a radiation such as, e.g., far ultraviolet rays, generate an acid in the exposed areas and come to have a difference in solubility in a developing solution between the areas irradiated with the actinic radiation and the unirradiated areas as a result of a reaction catalyzed by the acid to thereby form a pattern on the substrate.

Surfactants are generally incorporated into such chemical amplification type resist compositions in order to eliminate striations and the like and improve applicability. Examples of the surfactants in general use include nonionic surfactants such as polyoxyethylene alkyl ethers, polyoxyethylene alkylaryl ethers, polyoxyethylene/polyoxypropylene block copolymers, sorbitan fatty acid esters, and polyoxyethylene sorbitan fatty acid esters, and further include fluorochemical surfactants, organosiloxane polymers, and acrylic acid or methacrylic acid (co)polymers. In JP-B-7-21626 is disclosed a resist composition for semiconductor microfabrication which comprises an alkali-soluble resin, an organic solvent containing at least a monohydroxy monocarboxylic acid ester, a fluorochemical surfactant, and a radiation-sensitive substance. Furthermore, JP-A-7-230165 discloses a chemical amplification type photoresist composition employing a combination of a solvent of a specific structure and a fluorochemical surfactant, while JP-A-2000-162768 discloses one employing a fluorochemical surfactant having a specific structure.

With the recent trend toward scale down and higher throughputs, it has become important to diminish errors caused by exposure. However, the resists of the related art described above have a problem concerning defect generation during development and this has resulted in a considerable decrease in yield.

SUMMARY OF THE INVENTION

Accordingly, an object of the invention is to provide a positively photosensitive composition which is effective in considerably diminishing development defects.

The invention provides a positively photosensitive composition having the following constitutions, with which that object of the invention is accomplished.

Namely, the positive photoresist composition according to the invention has the following constitutions.

(1) A positive photoresist composition comprising:

(A) an oxime sulfonate compound represented by the following formula (1), (B) a resin comprising repeating units including a group represented by the following formula (X) and which increases the solubility in an alkaline developing solution by the action of an acid, and (C) a fluoroaliphatic-group-containing polymeric compound containing repeating units derived from a monomer represented by the following formula (2):

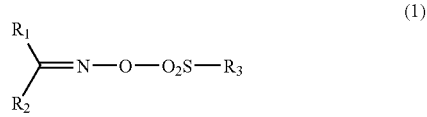

wherein $R_1$ and $R_2$ each independently represents an alkyl group, an alkenyl group, an alkynyl group, an aryl group, a heterocyclic group, or a cyano group, provided that $R_1$ and $R_2$ may be bonded to each other to form a ring, and $R_3$ represents an alkyl group or an aryl group, and $R_1$ and $R_2$ each may be bonded, through a single bond or a connecting group, to the $R_1$ or $R_2$ of another compound represented by formula (1):

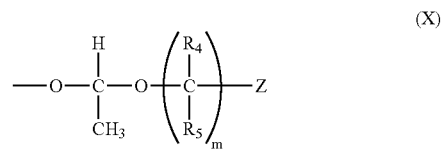

wherein $R_4$ and $R_5$ each independently represents a hydrogen atom or an alkyl group, Z represents an alkyl group, and m represents an integer of 1 to 20:

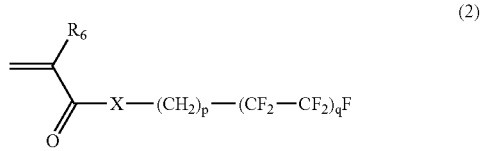

wherein $R_6$ represents a hydrogen atom or a methyl group, X represents an oxygen atom, a sulfur atom, or $-N(R_7)-$, p represents an integer of 1 to 6, and q represents an integer of 2 to 4, provided that $R_7$ represents a hydrogen atom or an alkyl group having 1 to 4 carbon atoms.

(2) The composition according to the above (1), further comprising a compound represented by the following formula (3) which is capable of generating an acid upon irradiation with actinic rays or a radiation:

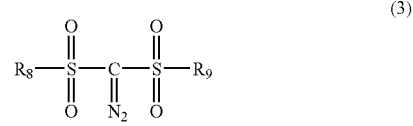

wherein $R_8$ and $R_9$ each independently represents an alkyl group or an aryl group.

(3) The composition according to the above (1), wherein the amount of the compound represented by formula (1) is from 0.1 to 10% by weight based on the solid ingredients in the composition.

(4) The composition according to the above (2), wherein the amount of the compound represented by formula (3) is from 0.01 to 7% by weight based on the solid ingredients in the composition.

(5) The composition according to the above (2), wherein the proportion by weight of the compound represented by formula (1) to the compound represented by formula (3) is from 90/10 to 15/85.

(6) The composition according to the above (1), wherein the content of the repeating units having a group represented by formula (X) is from 5 to 50% by mole based on all repeating units in the component (B).

(7) The composition according to the above (1), further comprising an organic basic compound.

(8) A method for forming a pattern, which comprises forming a resist film comprising the composition described in the above (1), exposing the resist film upon irradiation with the actinic rays or a radiation, and subsequently developing the resist film.

DETAILED DESCRIPTION OF THE INVENTION

The invention will be explained below in detail.

[1] (A) Compound Represented by Formula (1) capable of generating an acid upon irradiation with actinic rays or a radiation (hereinafter referred to as "compound (A)" or "component (A)" or photo-acid generator)

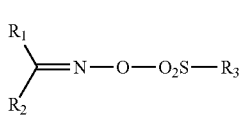

(1)

The compound represented by formula (1) is a compound (photo-acid generator) which is capable of generating an acid upon irradiation with actinic rays or a radiation for use in patterning, such as, e.g., KrF excimer laser light, ArF excimer laser light, or electron beams.

In formula (1), $R_1$ and $R_2$ each independently represents an alkyl group, an alkenyl group, an alkynyl group, an aryl group, a heterocyclic group, or a cyano group, provided that $R_1$ and $R_2$ may be bonded to each other to form a ring. $R_3$ represents an alkyl or an aryl group.

$R_1$ and $R_2$ may be bonded, through a single bond or connecting chain, to the $R_1$ or $R_2$ of another compound represented by formula (1).

Groups $R_1$ and $R_2$ each preferably has 1 to 16 carbon atoms and may have one or more substituents.

Group $R_3$ preferably has 1 to 16 carbon atoms, more preferably 2 to 12 carbon atoms, and may have one or more substituents.

The alkyl groups represented by $R_1$, $R_2$, and $R_3$ may be linear, branched, or cyclic, and preferably are alkyl groups having 1 to 16 carbon atoms. Examples of the linear or branched alkyl groups include alkyl groups such as methyl group, ethyl group, propyl group, isopropyl group, butyl group, isobutyl group, t-butyl group, t-amyl group, n-hexyl group, n-octyl group, isooctyl group, n-decyl group, undecyl group, dodecyl group, and hexadecyl group, and further include trifluoromethyl group, perfluoropropyl group, perfluorobutyl group, perfluoro-t-butyl group, perfluorooctyl group, perfluoroundecyl group, and 1,1-bistrifluoromethylethyl group.

The cycloalkyl groups each preferably has 3 to 8 carbon atoms. Examples thereof include a cyclopropyl group, a cyclopentyl group, and a cyclohexyl group.

The alkenyl groups represented by $R_1$ and $R_2$ may be linear, branched, or cyclic, and preferably are alkenyl groups having 2 to 16 carbon atoms. Examples of the linear or branched alkenyl groups include allyl group, methallyl group, vinyl group, methylallyl group, 1-butenyl group, 3-butenyl group, 2-butenyl group, 1,3-penadienyl group, 5-hexenyl group, 2-oxo-3-pentenyl group, decapentenyl group, and 7-octenyl group.

Examples of the cyclic alkenyl groups include cyclobutenyl group, cyclohexenyl group, cyclopentadienyl group, and bicyclo[4.2.4]dodeca-3,7-dien-5-yl group.

The alkynyl groups represented by $R_1$ and $R_2$ each preferably has 2 to 16 carbon atoms. Examples thereof include ethynyl group, propargyl group, 2-butynyl group, 4-hexynyl group, 2-octynyl group, phenylethynyl group, and cyclohexylethynyl group.

The aryl groups represented by $R_1$, R2, and $R_3$ each preferably has 5 to 16 carbon atoms. More preferred examples of the aryl groups include ones having 6 to 14 carbon atoms, such as phenyl group, tolyl group, methoxyphenyl group, and naphthyl group.

The heterocyclic groups preferably are ones having 5 to 15 carbon atoms. Examples thereof include the aforementioned aryl groups in which one or more of the ring-constituting atoms have been replaced by one or more heteroatoms. Specific examples thereof include thiophenefuryl group and thienyl group.

Examples of the substituents which may be possessed by each of the groups described above include alkyl groups (e.g., the same alkyl groups as those which may be represented by $R_1$, preferably ones having 1 to 4 carbon atoms), alkoxy groups (preferably ones having 1 to 4 carbon atoms, e.g., methoxy group, ethoxy group, hydroxyethoxy group, linear or branched propoxy group, and linear or branched butoxy), halogen atoms (e.g., fluorine atom, chlorine atom, and iodine atom), cyano group, hydroxygroup, carboxygroup, nitrogroup, aryloxygroups (preferably having 6 to 14 carbon atoms), alkylthio groups, aralkyl groups (preferably ones having 6 to 14 carbon atoms, e.g., benzyl group and naphthylmethyl group), and groups represented by the following formula (1A).

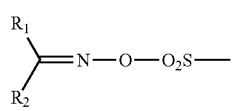

(1A)

In the formula, $R_1$ and $R_2$ have the same meanings as the $R_1$ and $R_2$ in formula (1).

$R_1$ and $R_2$ each may be bonded, through a single bond or a connecting chain, to the $R_1$ or $R_2$ of another compound represented by formula (1). Namely, the compound represented by formula (1) includes one having two or three oxime sulfonate structures bonded to each other through a connecting chain.

Examples of the connecting chain include alkylene chains (preferably having 1 to 10 carbon atoms), alkenylene chains (preferably having 1 to 10 carbon atoms), alkynylene chains (preferably having 1 to 10 carbon atoms), phenylene, furylene, thienylene, —O—, —S—, —N—, —CO—, and combinations of two or more of these.

Specific examples of the compound represented by formula (1) are shown below, but ingredient (A) in the invention should not be construed as being limited thereto.

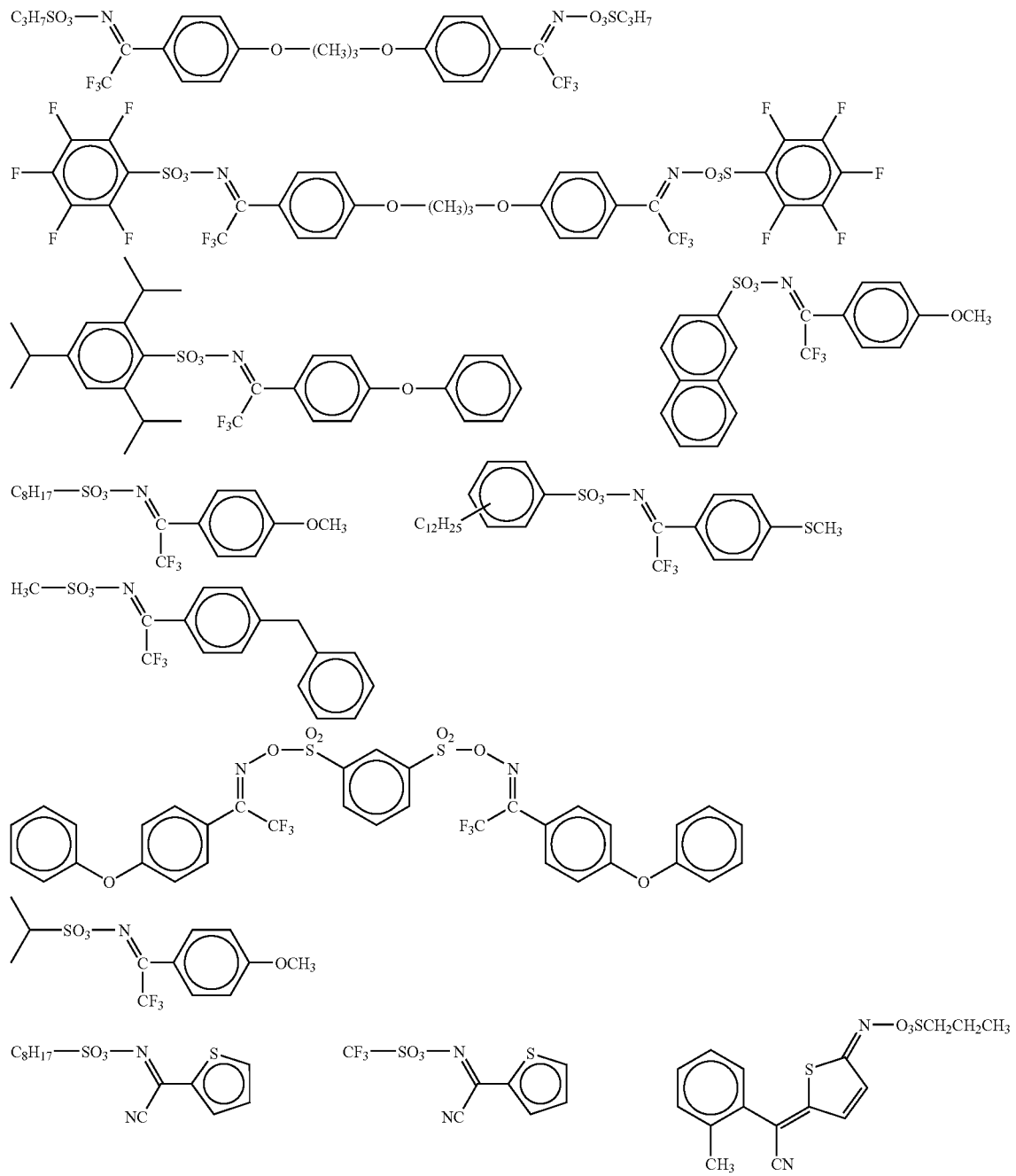

The compound represented by formula (1) to be used as ingredient (A) can be obtained, for example, by the method described in S. R. Sandier & W. Karo, *Organic Functional Group Preparations*, Vol.3, Academic Press. Specifically, the compound can be obtained by reacting a desired acid halide with an oxime compound synthesized, for example, by the reaction of a ketone with hydroxylamine or a salt thereof or by converting an "active" methylene group into a nitroso group with an alkyl nitrite or alkyl hydrogen nitrate.

The amount of the compound represented by formula (1) to be added is generally from 0.1 to 10% by weight, preferably from 0.25 to 8% by weight, more preferably from 0.5 to 4% by weight, based on the solid ingredients in the composition.

[2] The resist composition of the invention preferably further comprises a diazodisulfone compound represented by the following formula (3) as a compound which is capable of generating an acid upon irradiation with a radiation or actinic rays or a radiation (photo-acid generator).

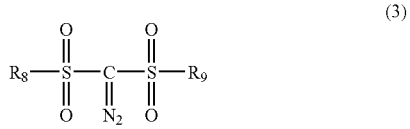

(3)

In the formula, $R_8$ and $R_9$ each independently represents an alkyl or aryl group.

The alkyl groups represented by $R_8$ and $R_9$ may be linear, branched, or cyclic and may have one or more substituents. Preferred examples of the linear or branched alkyl groups include ones having 1 to 4 carbon atoms, such as methyl group, ethyl group, propyl group, n-butyl group, sec-butyl group, and t-butyl group.

Preferred examples of the cycloalkyl groups include ones having 3 to 8 carbon atoms, such as cyclopropyl, cyclopentyl, and cyclohexyl.

The aryl groups represented by R8 and $R_9$ may have one or more substituents. Preferred examples thereof include ones having 6 to 14 carbon atoms, such as phenyl group, tolyl group, methoxyphenyl group, and naphthyl group.

Examples of the substituents which may be possessed by the alkyl groups and aryl groups represented by R8 and $R_9$ include alkoxy groups (preferably having 1 to 5 carbon atoms), halogen atoms (fluorine, chlorine, and iodine), cyano group, hydroxy group, carboxy group, and nitro group. With respect to the aryl groups, examples of the substituents further include alkyl groups, examples of which include the same alkyl groups as enumerated above.

Specific examples of the compound represented by formula (3) are shown below, but this compound usable in the invention should not be construed as being limited thereto.

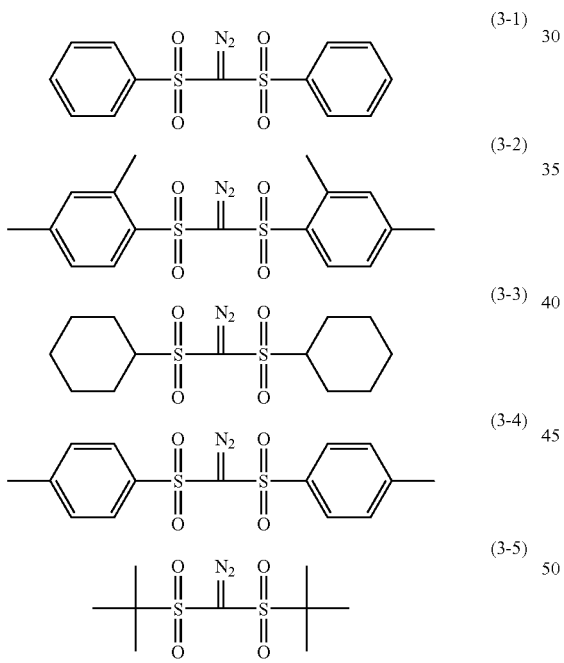

The compound represented by formula (3) can be synthesized, for example, by the method disclosed in Japanese Patent No. 3,024,621 which comprises diazotizing bissulfonylmethane with toluenesulfonyl azide.

The amount of the compound represented by formula (3) to be added, which is capable of generating an acid upon irradiation with actinic rays or a radiation, is generally from 0.01 to 7% by weight, preferably from 0.05 to 5% by weight, more preferably from 0.1 to 3% by weight, based on the solid ingredients in the composition.

The proportion (by weight) of the compound represented by formula (1) to the compound represented by formula (3) is preferably from 90/10 to 15/85, more preferably from 80/20 to 20/80, especially preferably from 70/30 to 40/60.

Other photo-acid generators may be used in the invention in combination with the photo-acid generators described above.

Such optional photo-acid generators for use in the invention can be suitably selected from photoinitiators for cationic photopolymerization, photoinitiators for free-radical photopolymerization, photodecolorants or optical color changers for dyes, known compounds for use in microresist production or the like which generate an acid upon irradiation with actinic rays or a radiation, and mixtures of two or more of these.

Examples thereof include onium salts such as diazonium salts, ammonium salts, phosphonium salts, iodonium salts, sulfonium salts, selenonium salts, and arsonium salts, organohalogen compounds, organometallic/organic halide combinations, photo-acid generators having an o-nitrobenzyl type protective group, and compounds which photodecompose to generate a sulfonic acid, represented by iminosulfonates.

Such photo-acid generators capable of being used in combination with the specific photo-acid generators according to the invention may be incorporated in an amount of generally up to 80 parts by weight per 100 parts by weight of the sum of the photo-acid generators represented by formula (1) and formula (3).

[3] (B) Resin which increases the solubility in an alkaline developing solution by the action of an acid (hereinafter referred to as "compound (B)" or "component (B)" or acid-decomposable resin)

The resist composition of the invention contains a resin comprising repeating units including a group represented by formula (X) as groups capable of dissociating by the action of an acid (acid-decomposable groups) and which increases the solubility in an alkaline developing solution by the action of an acid.

$$-O-\underset{\underset{CH_3}{|}}{\overset{\overset{H}{|}}{C}}-O-\left(\underset{\underset{R_5}{|}}{\overset{\overset{R_4}{|}}{C}}\right)_m-Z \quad (X)$$

In formula (X), $R_4$ and $R_5$ each independently represents a hydrogen atom or an alkyl group. Z represents an alkyl group.

Symbol m represents an integer of 1 to 20.

The alkyl groups represented by $R_4$ and $R_5$ may be linear, branched, or cyclic and may have one or more substituents.

The linear alkyl groups each have preferably 1 to 30, more preferably 1 to 20 carbon atoms. Examples thereof include methyl group, ethyl group, n-propyl group, n-butyl group, n-pentyl group, n-hexyl group, n-heptyl group, n-octyl group, n-nonyl group, and n-decanyl group.

The branched alkyl groups each has preferably 1 to 30, more preferably 1 to 20 carbon atoms. Examples thereof include isopropyl group, isobutyl group, t-butyl group, isopentyl group, t-pentyl group, isohexyl group, t-hexyl group, isoheptyl group, t-heptyl group, isooctyl group, t-octyl group, isononyl group, and t-decyl group.

The cycloalkyl groups each have preferably from 3 to 30, more preferably 3 to 20 carbon atoms. Examples thereof include cyclopropyl group, cyclobutyl group, cyclopentyl group, cyclohexyl group, cycloheptyl group, cyclooctyl group, cyclononyl group, and tetracyclododecanyl group.

The alkyl group represented by Z in formula (X) may be linear, branched, or cyclic and may have one or more substituents.

The linear or branched alkyl group preferably has 1 to 10 carbon atoms. Examples thereof include methyl group, ethyl group, n-propyl group, isopropyl group, n-butyl group, isobutyl group, t-butyl group, n-pentyl group, isopentyl group, t-pentyl group, n-hexyl group, isohexyl group, t-hexyl group, n-heptyl group, isoheptyl group, t-heptyl group, n-octyl group, isooctyl group, t-octyl group, n-nonyl group, isononyl group, t-nonyl group, n-decyl group, isodecyl group, and t-decyl group.

The cycloalkyl group preferably has 3 to 8 carbon atoms. Examples thereof include cyclopropyl group, cyclobutyl group, cyclopentyl group, cyclohexyl group, cycloheptyl group, and cyclooctyl group.

Examples of the substituents which may be possessed by the groups described above include hydroxy, halogen atoms (fluorine atom, chlorine atom, bromine atom, and iodine atom), nitro group, cyano group, the aforementioned alkyl groups, the aforementioned cycloalkyl groups, alkoxy groups such as methoxy group, ethoxy group, hydroxyethoxy group, propoxy group, hydroxypropoxy group, n-butoxy group, isobutoxy group, sec-butoxy group, and t-butoxy group, alkoxycarbonyl groups such as methoxycarbonyl group and ethoxycarbonyl group, aralkyl groups such as benzyl group, phenethyl group, and cumyl group, aralkyloxy groups, acyl groups such as formyl group, acetyl group, butyryl group, benzoyl group, cinnamoyl group, and valeryl group, acyloxy groups such as butyryloxy group, the aforementioned alkenyl groups, alkenyloxy groups such as vinyloxy group, propenyloxy group, allyloxy group, and butenyloxy group, aryloxy groups such as phenoxy group, and aryloxycarbonyl groups such as benzoyloxy group.

These substituents each may have one or more substituents.

The resin having acid-decomposable groups described above is a compound which has a structure formed by incorporating acid-decomposable groups into a compound having a molecular-weight distribution and obtained by polymerizing one or more monomers and which becomes alkali-soluble by the action of an acid.

The resin including acid-decomposable groups described above is a resin which includes acid-decomposable groups on the main chain or side chains of the resin or on both the main chain and side chains. Preferred is a resin including acid-decomposable groups on side chains thereof.

In the case where acid-decomposable groups are to be bonded as side chains to a base resin, this base resin may be an alkali-soluble resin having —OH or —COOH groups in side chains, preferably having —R⁰—COOH or —Ar—OH groups as side chains.

In those groups, —R⁰— represents an optionally substituted, aliphatic or aromatic hydrocarbon group having a valence of 2 or higher, and —Ar— represents an optionally substituted, monocyclic or polycyclic aromatic group having a valence of 2 or higher.

A preferred base resin in the invention is an alkali-soluble resin having phenolic hydroxyl groups.

The alkali-soluble resin having phenolic hydroxyl groups to be used in the invention preferably is a copolymer containing at least 30% by mole, preferably at least 50% by mole, repeating units derived from o-, m-, or p-hydroxystyrene (these are inclusively referred to as hydroxystyrene) or from o-, m-, or p-hydroxy-α-methylstyrene (these are inclusively referred to as hydroxy-α-methylstyrene), or is a homopolymer of hydroxystyrene or hydroxy-α-methylstyrene or a resin obtained from the copolymer or homopolymer by partly hydrogenating the benzene nuclei of those units. More preferred is a p-hydroxystyrene homopolymer.

Preferred examples of the monomers usable besides hydroxystyrene and hydroxy-α-methylstyrene for producing the copolymer by copolymerization include acrylic esters, methacrylic esters, acrylamide and derivatives thereof, methacrylamide and derivatives thereof, acrylonitrile, methacrylonitrile, maleicanhydride, styrene, α-methylstyrene, acetoxystyrene, alkoxystyrenes, and alkylstyrenes. More preferred are styrene, acetoxystyrene, and t-butylstyrene.

Examples of preferred resins for use in the invention include the following ones. These resins can be especially advantageously used when a pattern is to be formed through exposure with a KrF excimer laser.

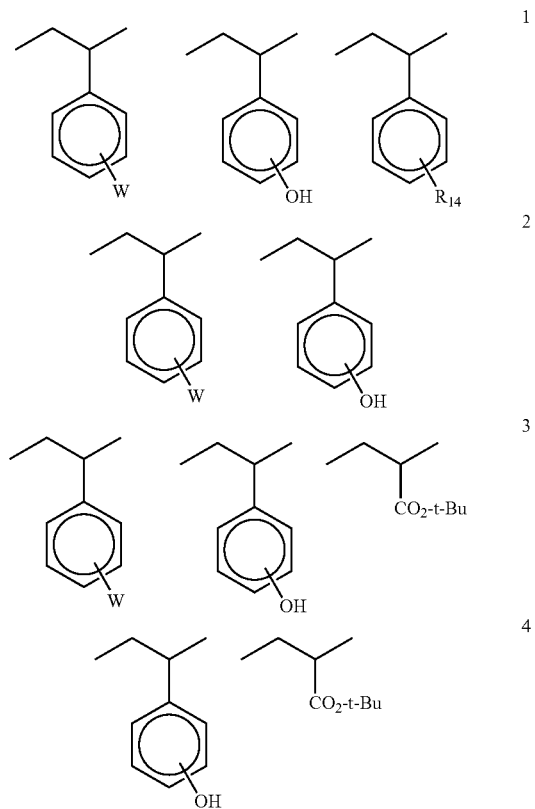

In the formulae given above, W represents an acid-decomposable group represented by formula (X). $R^{14}$ represents an acid-stable group.

$R^{14}$, which is a group not dissociating by the action of an acid (referred to as an acid-stable group), represents a hydrogen atom, halogen atom, alkyl group, alkoxy group, or acyloxy group.

Preferred examples of the alkyl group as the acid-stable group represented by $R^{14}$ include alkyl groups having 1 to 4 carbon atoms, such as methyl group, ethyl group, propyl group, n-butyl group, sec-butyl group, and t-butyl group.

Preferred examples of the alkoxy group include alkoxy groups having 1 to 4 carbon atoms, such as methoxy group, ethoxy group, hydroxyethoxy group, propoxy group, hydroxypropoxy group, n-butoxy group, isobutoxy group, and sec-butoxy group.

Preferred examples of the acyloxy group include ones having 2 to 7 carbon atoms, such as acetoxy group, propanoyloxy group, butanoyloxy group, and benzoyloxy group.

Specific examples of the groups represented by formula (X) are shown below, but the groups should not be construed as being limited to these examples.

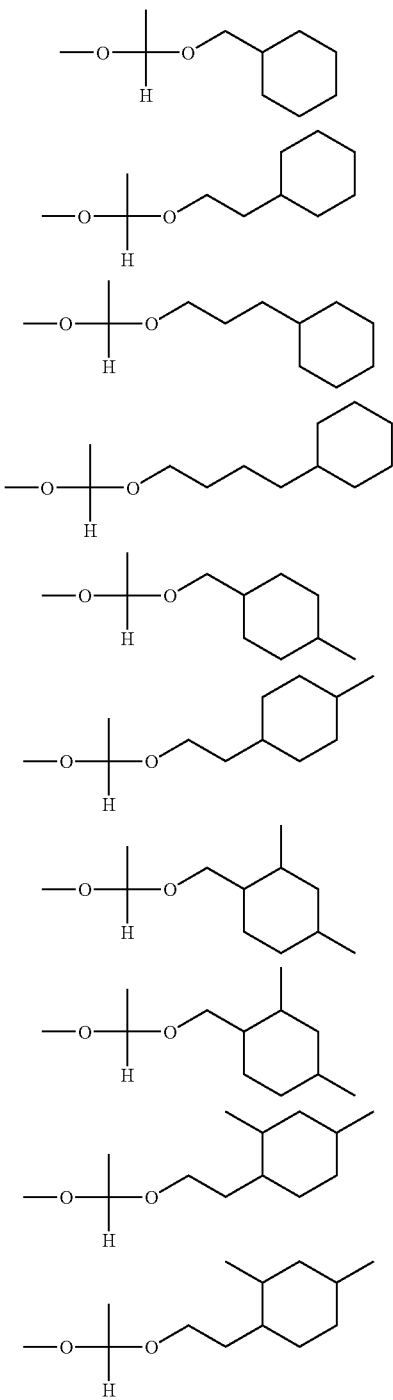

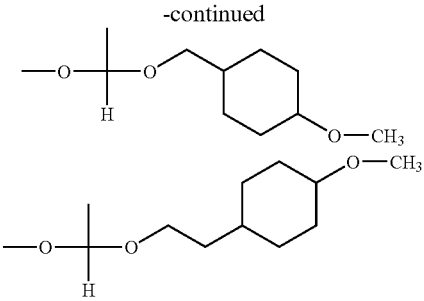
-continued

In such a resin to be used in the invention, the content of the repeating units (structural units) having a group represented by formula (X) is preferably from 5 to 50% by mole, more preferably from 5 to 30% by mole, based on all repeating units.

The resin having groups represented by formula (X) in the invention may contain other acid-decomposable groups besides the groups represented by formula (X).

The resin having groups represented by formula (X) can be obtained by synthesizing the corresponding vinyl ether and reacting it by a known method with an alkali soluble resin containing phenolic hydroxyl groups which has been dissolved in an appropriate solvent, e.g., tetrahydrofuran.

This reaction is generally conducted in the presence of an acid catalyst, preferably an acid ion-exchange resin, hydrochloric acid, p-toluenesulfonic acid, or a salt such as pyridinium tosylate. The corresponding vinyl ether can be synthesized from an active starting material, such as chloroethyl vinyl ether, by a method such as, e.g., nucleophilic substitution reaction. It can be synthesized also with a mercury or palladium catalyst.

Another method usable for the synthesis comprises conducting acetal interchange using the corresponding alcohol and a vinyl ether. In this case, the substituent to be incorporated is possessed by the alcohol, and the vinyl ether to be caused to coexist therewith is a relatively unstable vinyl ether such as t-butyl vinyl ether. This reaction is conducted in the presence of an acid such as p-toluenesulfonic acid or pyridinium tosylate.

Examples of the repeating units having a group represented by formula (X) in the resin described above include repeating units represented by the following formula (VI).

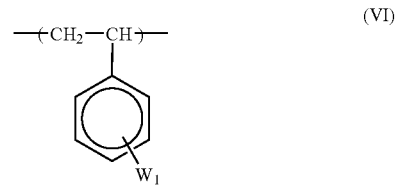

Substituent $W_1$ in formula (VI) represents a group represented by formula (X).

Specific examples of the repeating units represented by formula (VI) are shown below, but the resin to be used in the invention should not be construed as being limited to ones having these repeating units.

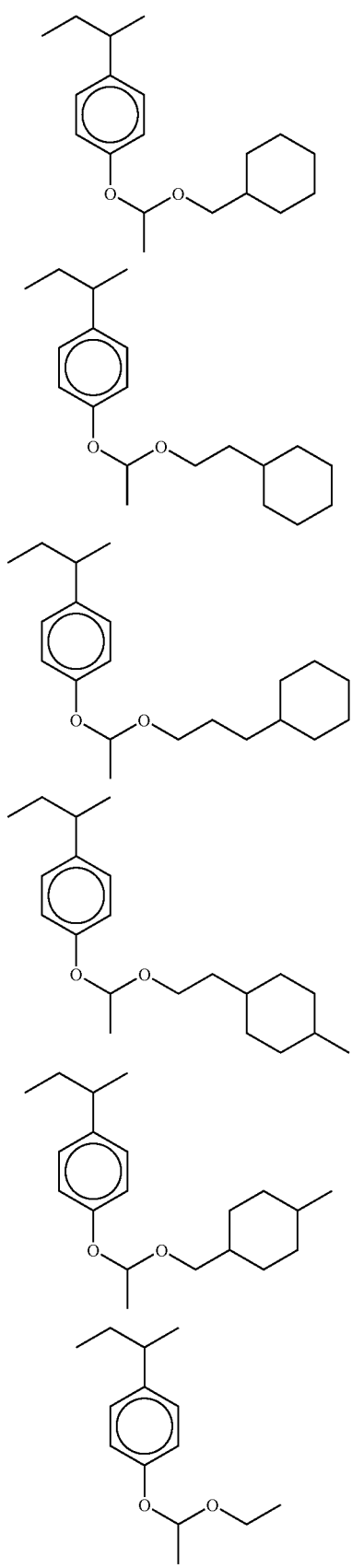

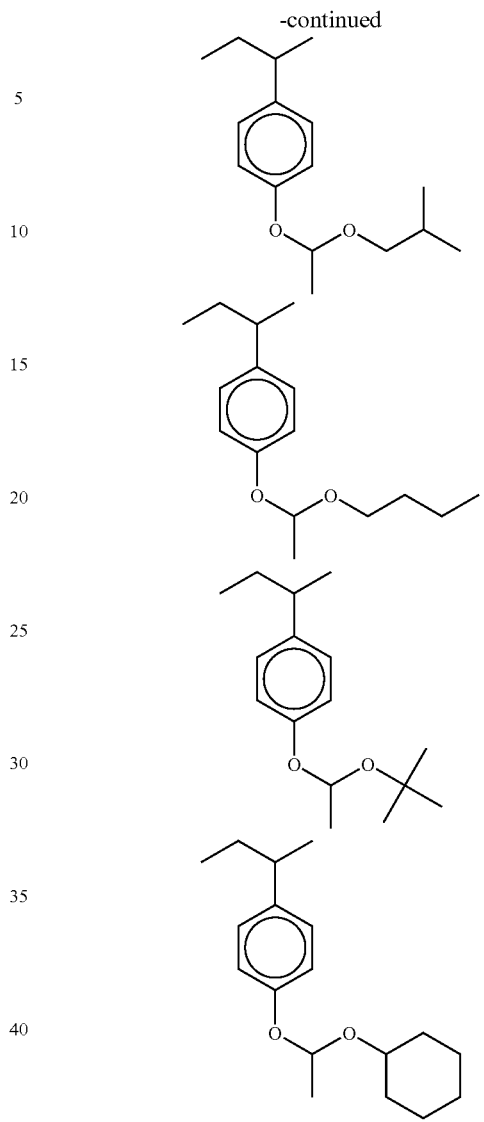

Preferred examples of repeating units copolymerizable with repeating units represented by formula (VI) include repeating units represented by the following formula (VII) and formula (VIII).

The incorporation of these repeating units into the resin is effective in controlling the decomposition of the resin with an acid and the solubility thereof in an alkaline developing solution. By the incorporation of these structural groups, a profile with excellent rectangularity can be attained. Furthermore, the incorporation is effective in regulating the amount of repeating units represented by formula (VI).

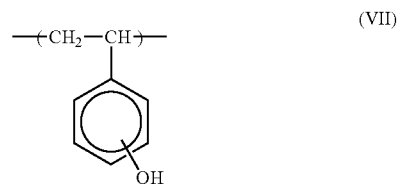

(VII)

-continued

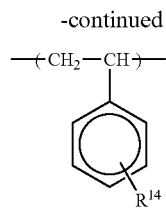
(VIII)

$R^{14}$, which is a group not dissociating by the action of an acid (referred to as an acid-stable group), represents a hydrogen atom, halogen atom, alkyl group, alkoxy group, or acyloxy group.

Preferred examples of the alkyl group as the acid-stable group represented by $R^{14}$ include alkyl groups having 1 to 4 carbon atoms, such as methyl group, ethyl group, propyl group, n-butyl group, sec-butyl group, and t-butyl group.

Preferred examples of the alkoxy group include alkoxy groups having 1 to 4 carbon atoms, such as methoxy group, ethoxy group, hydroxyethoxy group, propoxy group, hydroxypropoxy group, n-butoxy group, isobutoxy group, and sec-butoxy group.

Preferred examples of the acyloxy group include ones having 2 to 7 carbon atoms, such as acetoxy group, propanoyloxy group, butanoyloxy group, and benzoyloxy group.

Specific examples of polymerizable monomers usable for incorporating such repeating units represented by formula (VIII) include the following. However, the usable monomers should not be construed as being limited to these examples.

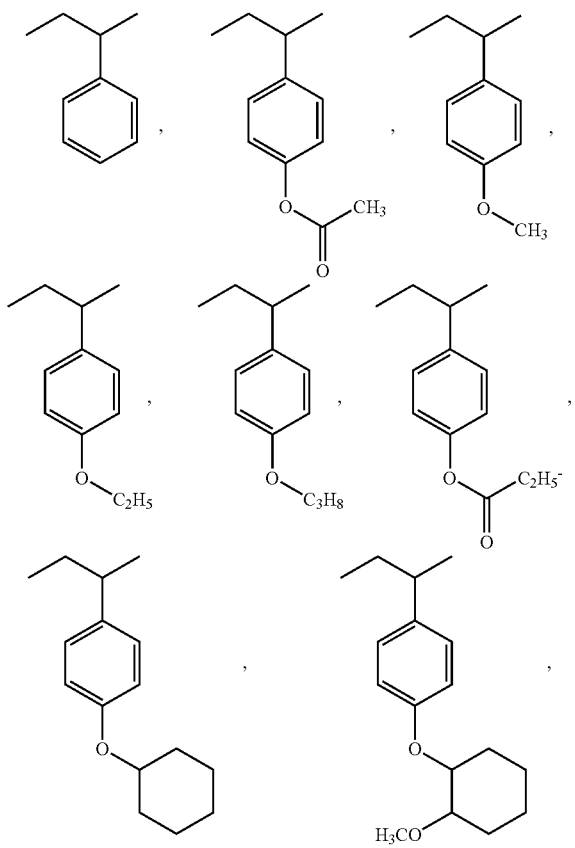

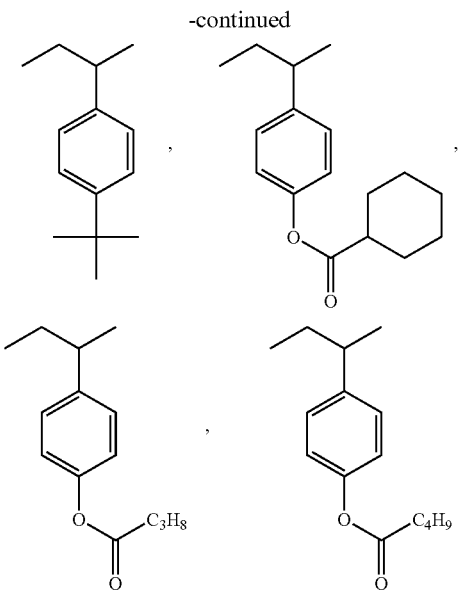

The resin containing repeating units represented by formula (VII) or formula (VIII) can be obtained, for example, by reacting a phenolic resin or a monomer thereof with an acid anhydride in the presence of a base or with the corresponding halide in the presence of a base.

Examples of the resin according to the invention include one comprising units represented by formula (VI) and units represented by formula (VII), one comprising units represented by formula (VI), units represented by formula (VII), and units represented by formula (VIII), and one comprising units represented by formula (VI), units represented by formula (VII), and t-butyl acrylate units.

The resin according to the invention preferably is a blend containing a resin (resin (B')) comprising units represented by formula (VI), units represented by formula (VII), and units represented by formula (VIII) as shown below.

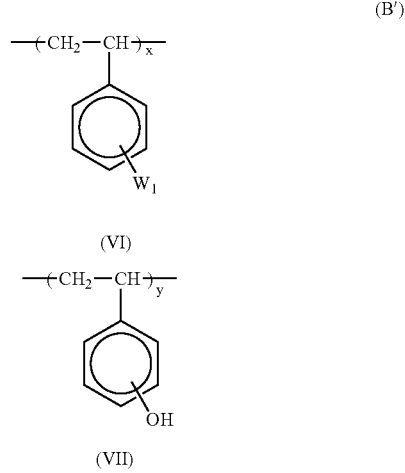

-continued

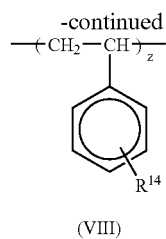

(VIII)

In formulae (VI) to (VIII), $R^{14}$ represents the acid-stable group described above, and $W_1$ represents a group represented by formula (X).

Symbols x and y each are 1 to 100 and z is 0 to 100, provided that x+y+z=100.

In the resin according to the invention which is made up of units represented by formula (VI) and units represented by formula (VII), the proportion of the repeating units represented by formula (VI) is generally from 10 to 45% by mole, preferably from 15 to 40% by mole.

In the resin made up of units represented by formula (VI), units represented by formula (VII), and t-butyl acrylate units, the proportion of the units represented by formula (VI) and that of the t-butyl acrylate units are generally from 0 to 20% by mole and from 5 to 25% by mole, respectively. Preferably, the proportion of the units represented by formula (VI) and that of the t-butyl acrylate units are from 5 to 20% by mole and from 10 to 20% by mole, respectively.

In the resin (B') which may be contained in the resin according to the invention, the proportions x, y, and z preferably satisfy the following requirements.

When z=0,
   0.05<x/(x+y)<0.50
   more preferably 0.1<x/(x+y)<0.45.

When z>0,
   (1) 0.05<x/(x+y+z)<0.35,
   (2) 0.005<z/(x+y+z)<0.25,
   (3) x≧z, and
   (4) 0.5<x/(x+z)<0.95, more preferably
   (1) 0.1<x/(x+y+z)<0.25,
   (2) 0.01<z/(x+y+z)<0.15,
   (3) x≧z, and
   (4) 0.5<x/(x+z)<0.85.

When the resin according to the invention satisfies those requirements, profile rectangularity is improved and, in particular, development defects are further diminished.

The repeating units represented by formula (VI), formula (VII), or formula (VIII) present in the resin or the repeating units derived from any other polymerizable monomer which may be present in the resin each may be of one kind or comprise a combination of two or more kinds.

The resin to be contained in the positive photoresist composition of the invention may be one in which one or more other appropriate monomers have been copolymerized so as to incorporate alkali-soluble groups, e.g., phenolic hydroxyl groups or carboxyl groups, and to thereby enable the resin to retain satisfactory developability with an alkaline developing solution.

Examples of such repeating units in the resin according to the invention are shown below, but the resin to be used in the invention should not be construed as being limited to ones comprising these units.

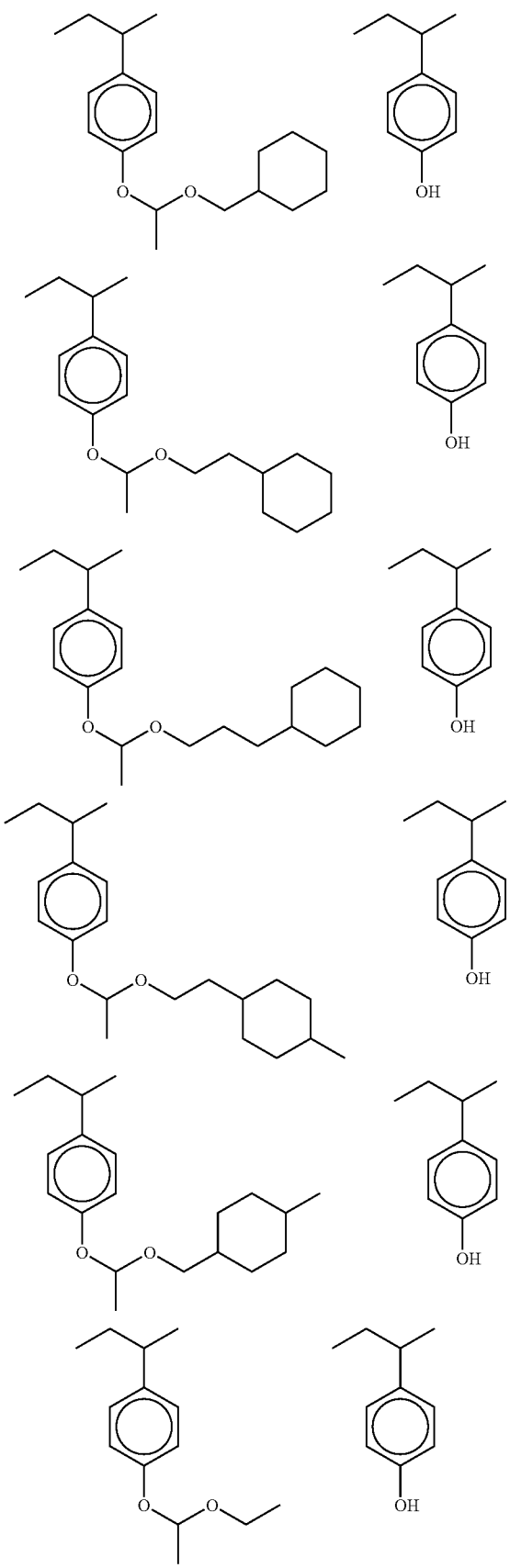

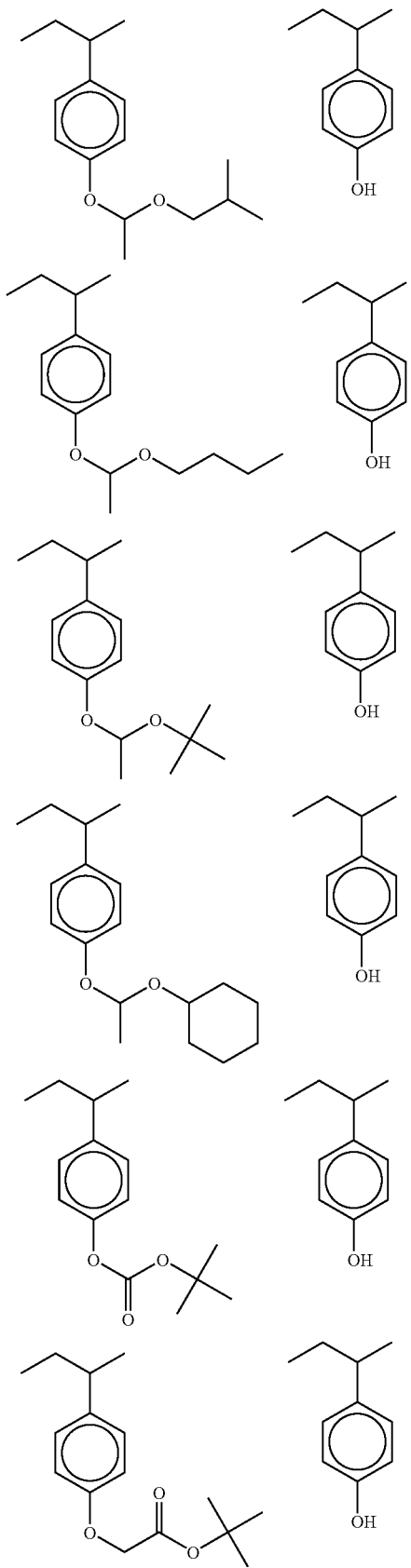
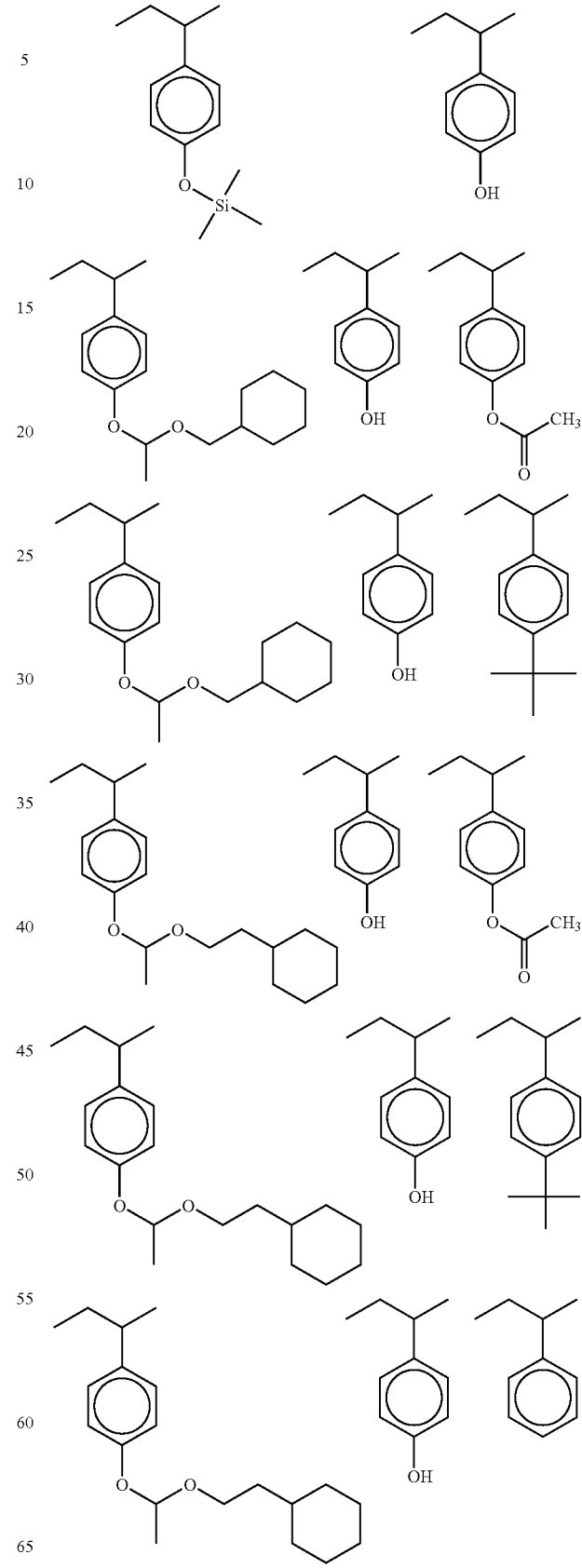

-continued

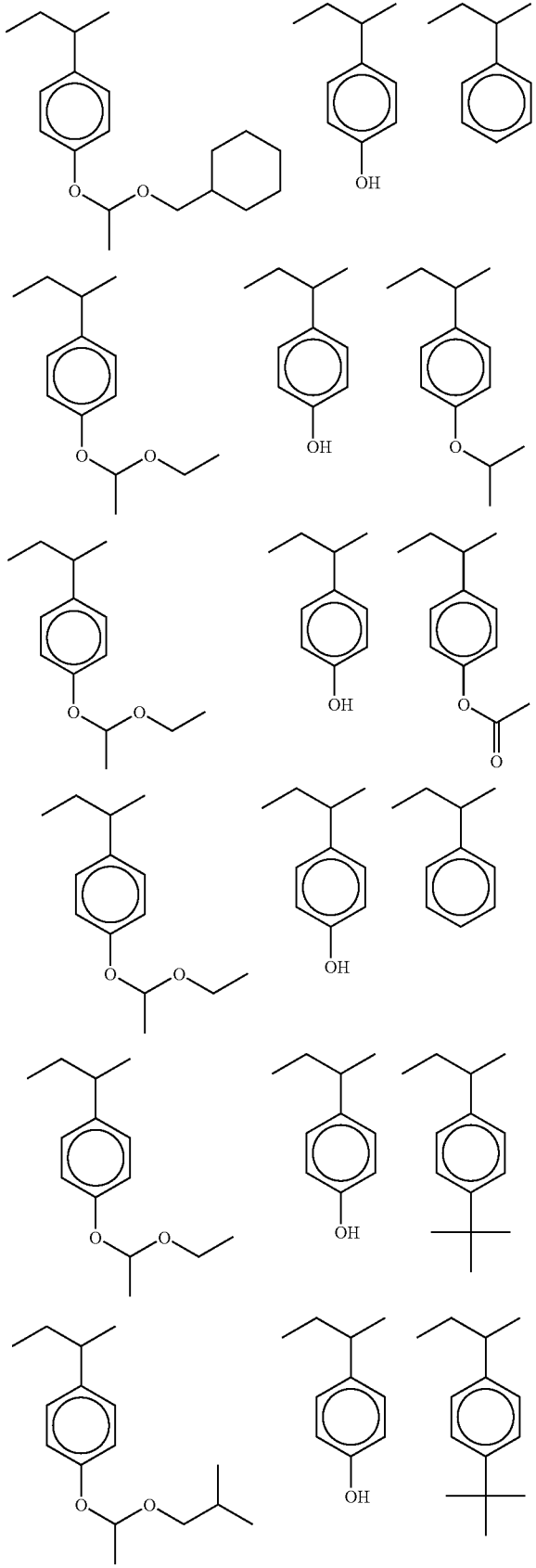

The molecular weight of the resin described above is generally 2,000 or higher, preferably from 3,000 to 200,000, more preferably from 5,000 to 70,000, in terms of weight-average molecular weight (Mw; calculated for standard polystyrene). The dispersity ratio (Mw/Mn) thereof is preferably from 1.0 to 4.0, more preferably from 1.0 to 3.5, especially preferably from 1.0 to 3.0. The smaller the dispersity ratio, the better the heat resistance and image-forming properties (pattern profile, defocus latitude, etc.).

The content of the resin described above in the positive photoresist composition (excluding the solvent for application) is preferably from 50 to 99% by weight, more preferably from 75 to 98% by weight.

[4] Fluoroaliphatic-group-containing Polymeric Compound (C)

The fluoroaliphatic-group-containing polymeric compound (C) to be used in the invention is a polymer including repeating units derived from a monomer represented by formula (2) described above (hereinafter referred to also as fluoropolymer).

Although the fluoropolymer to be used in the invention is not particularly limited as long as it satisfies that requirement, useful fluoropolymers are acrylic resins, methacrylic resins, and copolymers thereof with one or more vinyl monomers copolymerizable therewith.

One kind of the fluoroaliphatic groups in the fluoropolymer according to the invention are derived from a fluoroaliphatic compound produced by the telomerization method (also called the telomer method) or by the oligomerization method (also called the oligomer method). These processes for producing a fluoroaliphatic compound are described, for example, in *Fusso Kagôbutsu No Gôsei To Kinô* (supervised by Nobuo Ishikawa, published by CMC Publishing Co., Ltd., 1987) pp.117–118 and *Chemistry of Organic Fluorine Compounds II* (Monograph 187, ed. by Milos Hudlicky and Attila E. Pavlath, American Chemical Society, 1995) pp.747–752. The telomerization method is a process in which an alkyl halide having a large chain transfer constant, e.g., an iodide, is used as a telogen to conduct radical polymerization of a fluorine-containing vinyl compound, e.g., tetrafluoroethylene, to synthesize a telomer (an example is shown by Scheme 1).

Scheme 1

The iodine-terminated telomer obtained is usually subjected to an appropriate terminal chemical modification, such as those shown by Scheme 2, and thereby converted to fluoroaliphatic compounds. These compounds are further converted, according to need, into desired monomer structures before being used in producing a fluoroaliphatic-group-containing polymer.

Scheme 2

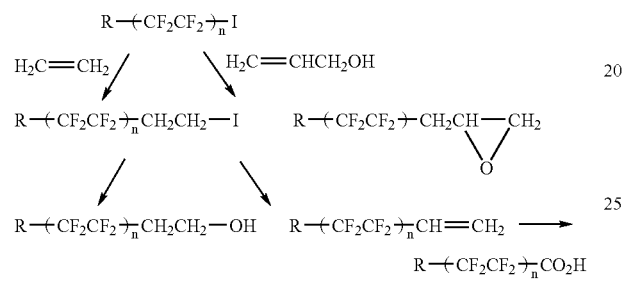

In formula (2) in the invention, $R_6$ represents a hydrogen atom or methyl group, and X represents an oxygen atom, sulfur atom, or $-N(R_7)-$, wherein $R_7$ represents a hydrogen atom or an alkyl group having 1 to 4 carbon atoms, i.e., methyl group, ethyl group, propyl group, or butyl group. Preferably, $R_7$ is a hydrogen atom or methyl group. X preferably is an oxygen atom.

Symbol p in formula (2) is an integer of 1 to 6, especially preferably 2.

Symbol q in formula (2) is 2 to 4. A mixture of monomers represented by formula (2) in which q is two or more of 2 to 4 may be used.

Specific examples of the fluoroaliphatic-group-containing monomer represented by formula (2) are shown below, but the monomer should not be construed as being limited to these examples.

F-1
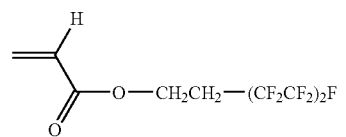

F-2
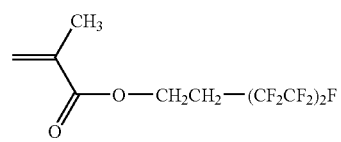

F-3
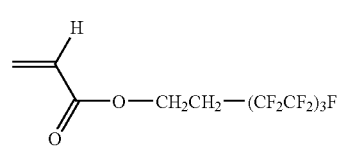

F-4
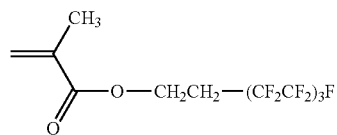

F-5
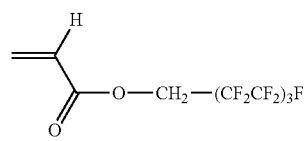

F-6
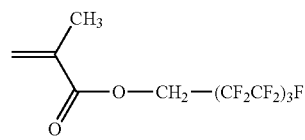

F-7
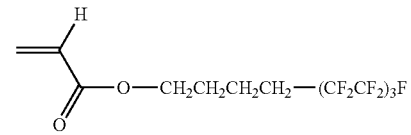

F-8
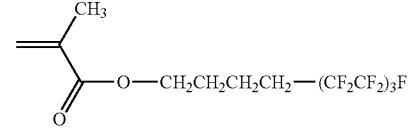

F-9
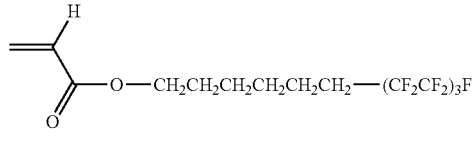

F-10
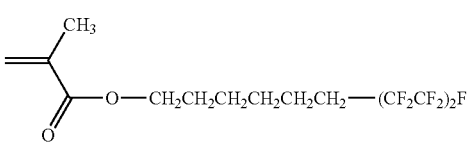

F-11
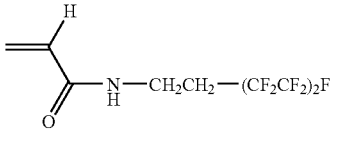

F-12
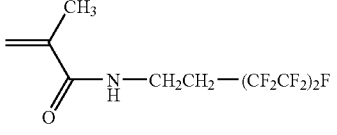

F-13
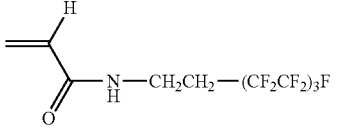

F-14
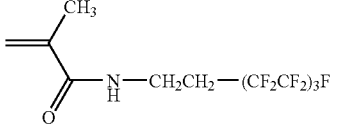

-continued
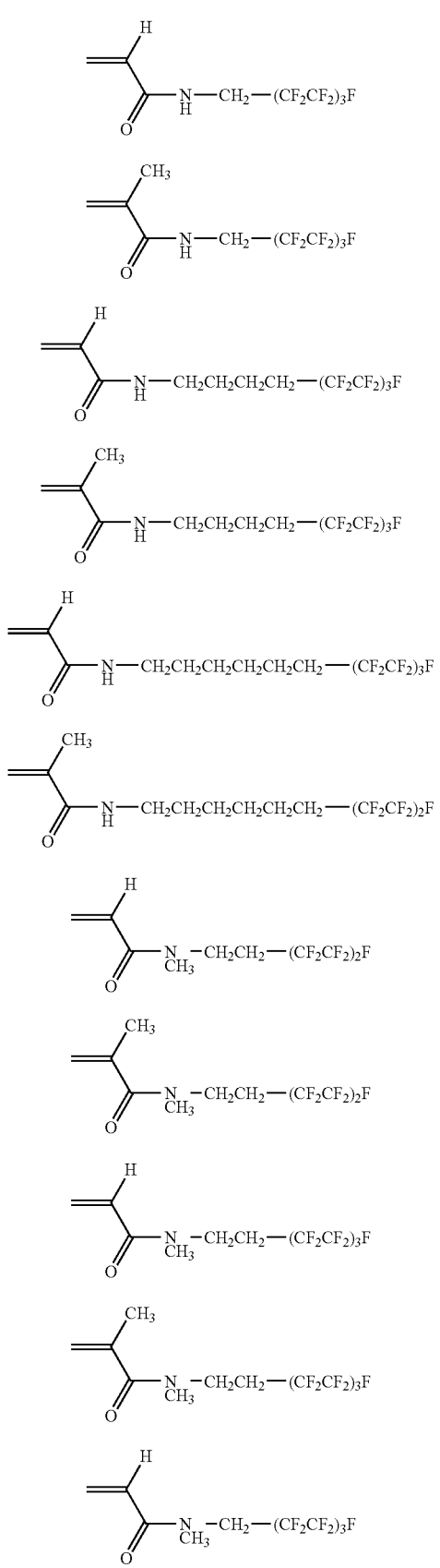
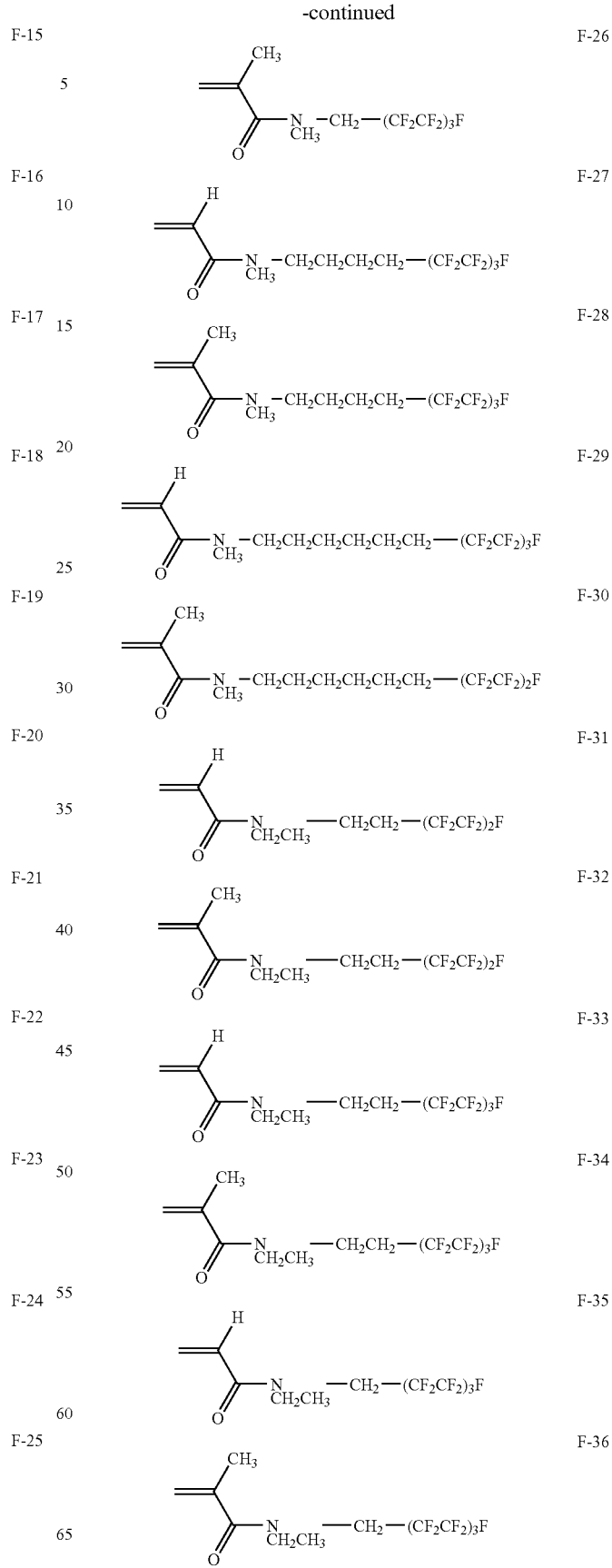

F-37
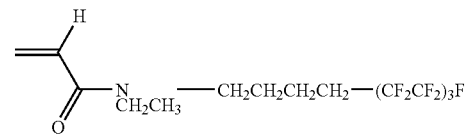
F-38
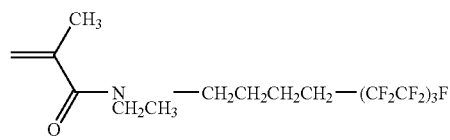
F-39
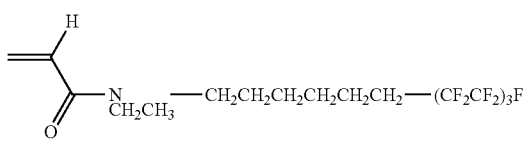
F-40
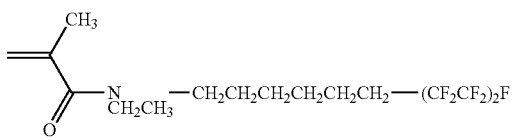
F-41
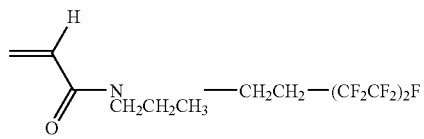
F-42
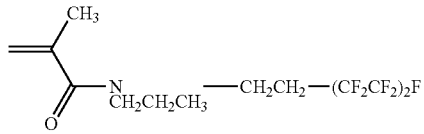
F-43
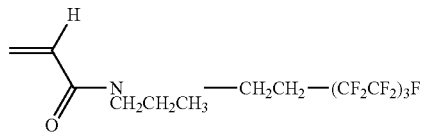
F-44
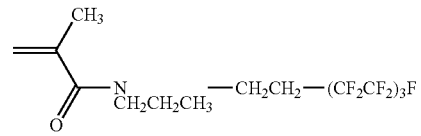
F-45
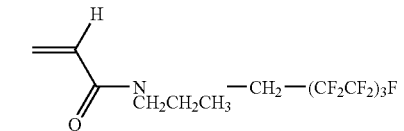
F-46
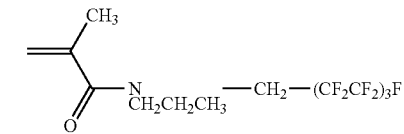
F-47
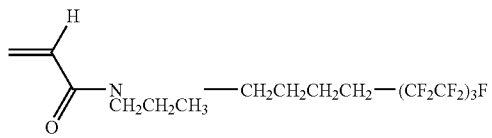
F-48
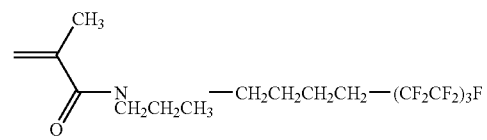
F-49
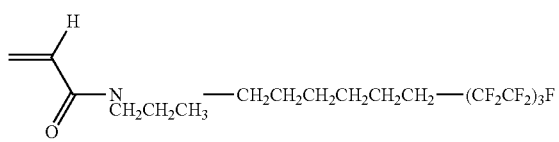
F-50
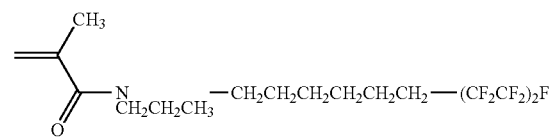
F-51
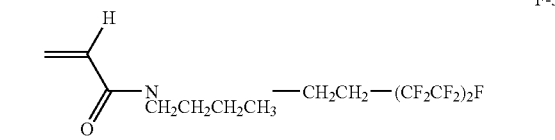
F-52
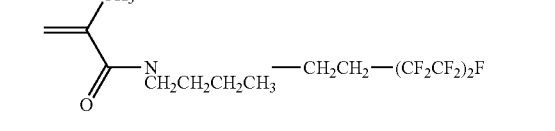
F-53
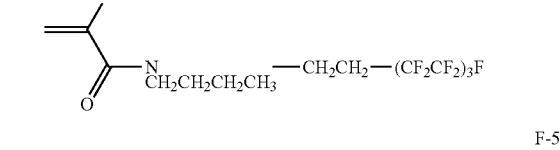
F-54
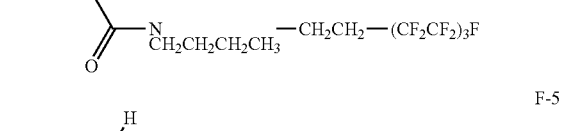
F-55
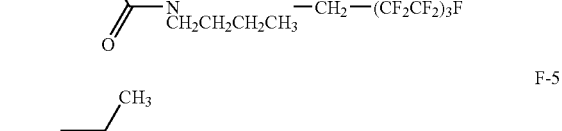
F-56
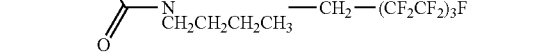

-continued
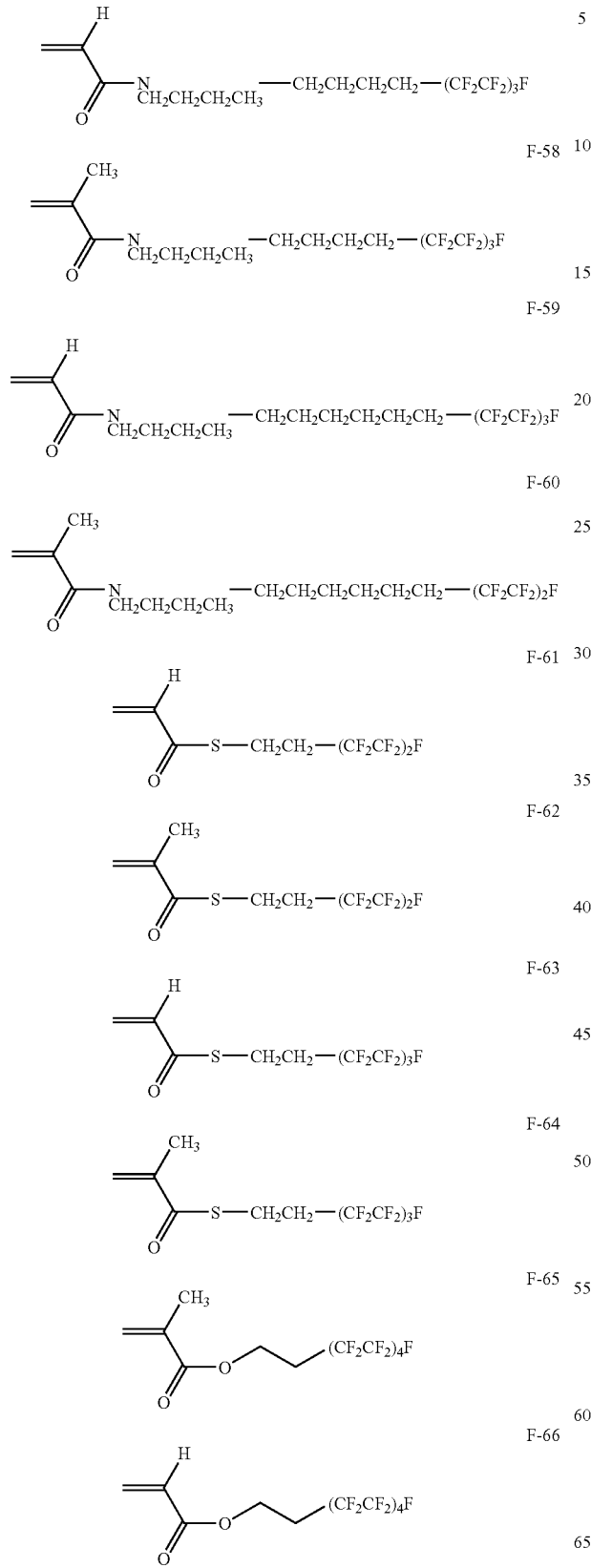
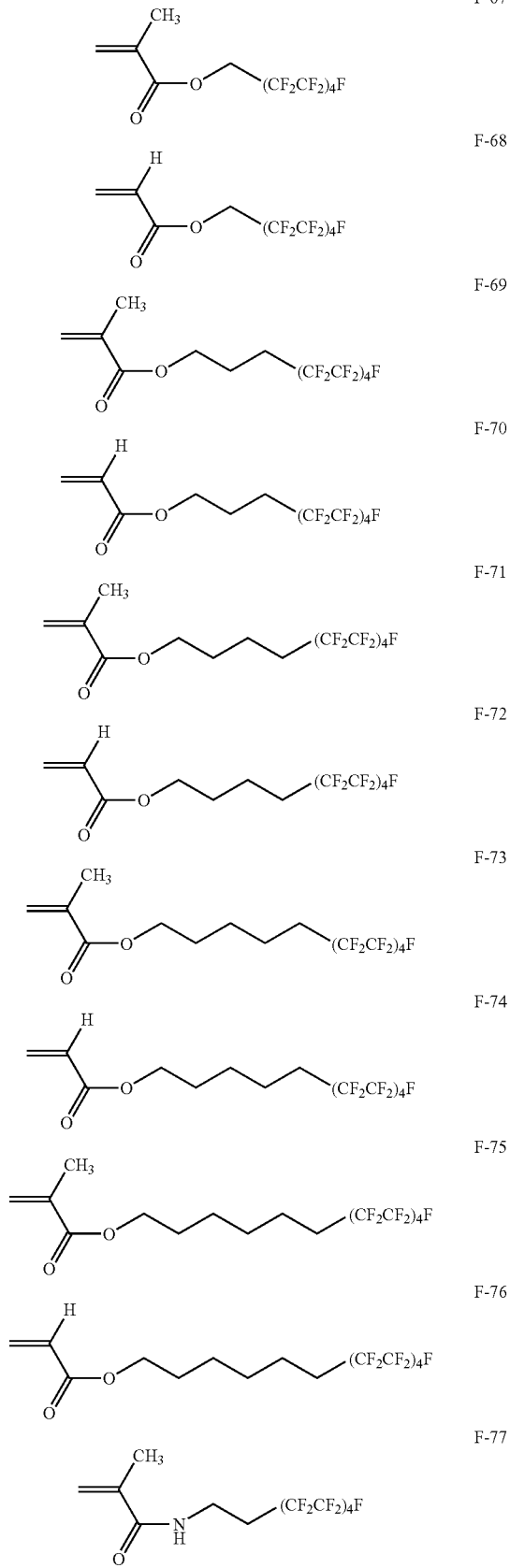

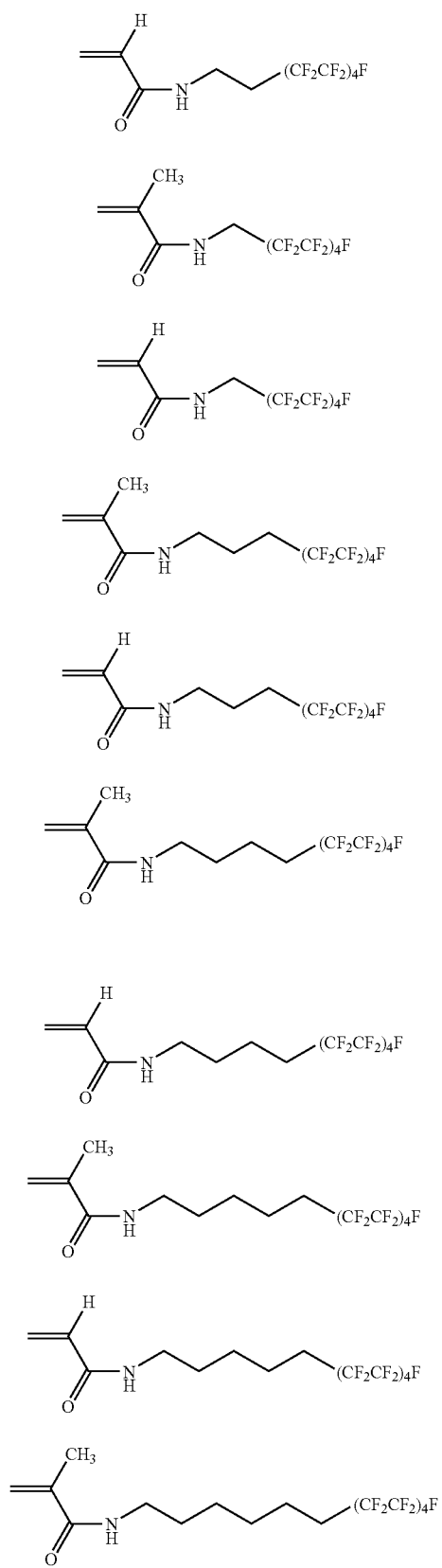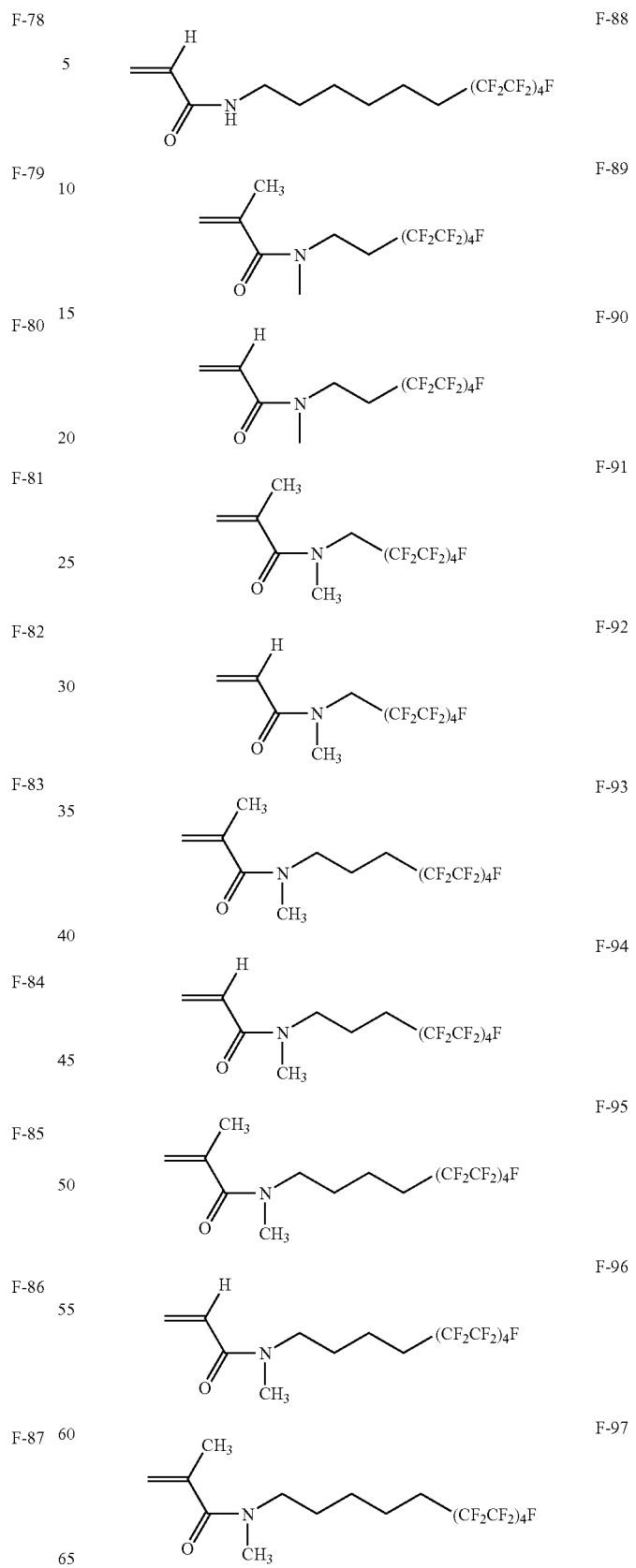

-continued

F-98: CH2=CH-C(=O)-N(CH3)-(CH2)5-(CF2CF2)4F

F-99: CH2=C(CH3)-C(=O)-N(CH3)-(CH2)6-(CF2CF2)4F

F-100: CH2=CH-C(=O)-N(CH3)-(CH2)7-(CF2CF2)4F

F-101: CH2=C(CH3)-C(=O)-N(C2H5)-(CH2)2-(CF2CF2)4F

F-102: CH2=CH-C(=O)-N(C2H5)-(CH2)2-(CF2CF2)4F

F-103: CH2=C(CH3)-C(=O)-N(C2H5)-(CH2)3-(CF2CF2)4F

F-104: CH2=CH-C(=O)-N(C2H5)-(CH2)3-(CF2CF2)4F

F-105: CH2=C(CH3)-C(=O)-N(C2H5)-(CH2)4-(CF2CF2)4F

F-106: CH2=CH-C(=O)-N(C2H5)-(CH2)4-(CF2CF2)4F

F-107: CH2=C(CH3)-C(=O)-N(C2H5)-(CH2)5-(CF2CF2)4F

-continued

F-108: CH2=CH-C(=O)-N(C2H5)-(CH2)5-(CF2CF2)4F

F-109: CH2=C(CH3)-C(=O)-N(C2H5)-(CH2)6-(CF2CF2)4F

F-110: CH2=CH-C(=O)-N(C2H5)-(CH2)6-(CF2CF2)4F

F-111: CH2=C(CH3)-C(=O)-N(C2H5)-(CH2)7-(CF2CF2)4F

F-112: CH2=CH-C(=O)-N(C2H5)-(CH2)7-(CF2CF2)4F

F-113: CH2=C(CH3)-C(=O)-N(C3H7)-(CH2)2-(CF2CF2)4F

F-114: CH2=CH-C(=O)-N(C3H7)-(CH2)2-(CF2CF2)4F

F-115: CH2=C(CH3)-C(=O)-N(C3H7)-(CH2)3-(CF2CF2)4F

F-116: CH2=CH-C(=O)-N(C3H7)-(CH2)3-(CF2CF2)4F

F-117: CH2=C(CH3)-C(=O)-N(C3H7)-(CH2)4-(CF2CF2)4F

-continued

F-118: CH₂=CH-C(=O)-N(C₃H₇)-(CH₂)₃-(CF₂CF₂)₄F

F-119: CH₂=C(CH₃)-C(=O)-N(C₃H₇)-(CH₂)₄-(CF₂CF₂)₄F

F-120: CH₂=CH-C(=O)-N(C₃H₇)-(CH₂)₄-(CF₂CF₂)₄F

F-121: CH₂=C(CH₃)-C(=O)-N(C₃H₇)-(CH₂)₅-(CF₂CF₂)₄F

F-122: CH₂=CH-C(=O)-N(C₃H₇)-(CH₂)₅-(CF₂CF₂)₄F

F-123: CH₂=C(CH₃)-C(=O)-N(C₃H₇)-(CH₂)₆-(CF₂CF₂)₄F

F-124: CH₂=CH-C(=O)-N(C₃H₇)-(CH₂)₆-(CF₂CF₂)₄F

F-125: CH₂=C(CH₃)-C(=O)-N(C₄H₉)-(CH₂)₂-(CF₂CF₂)₄F

F-126: CH₂=CH-C(=O)-N(C₄H₉)-(CH₂)₂-(CF₂CF₂)₄F

F-127: CH₂=C(CH₃)-C(=O)-N(C₄H₉)-(CH₂)₂-(CF₂CF₂)₄F

-continued

F-128: CH₂=CH-C(=O)-N(C₄H₉)-(CH₂)₂-(CF₂CF₂)₄F

F-129: CH₂=C(CH₃)-C(=O)-N(C₄H₉)-(CH₂)₃-(CF₂CF₂)₄F

F-130: CH₂=CH-C(=O)-N(C₄H₉)-(CH₂)₃-(CF₂CF₂)₄F

F-131: CH₂=C(CH₃)-C(=O)-N(C₄H₉)-(CH₂)₄-(CF₂CF₂)₄F

F-132: CH₂=CH-C(=O)-N(C₄H₉)-(CH₂)₄-(CF₂CF₂)₄F

F-133: CH₂=C(CH₃)-C(=O)-N(C₄H₉)-(CH₂)₅-(CF₂CF₂)₄F

F-134: CH₂=CH-C(=O)-N(C₄H₉)-(CH₂)₅-(CF₂CF₂)₄F

F-135: CH₂=C(CH₃)-C(=O)-N(C₄H₉)-(CH₂)₆-(CF₂CF₂)₄F

F-136: CH₂=CH-C(=O)-N(C₄H₉)-(CH₂)₆-(CF₂CF₂)₄F

F-137: CH₂=C(CH₃)-C(=O)-S-(CH₂)₂-(CF₂CF₂)₄F

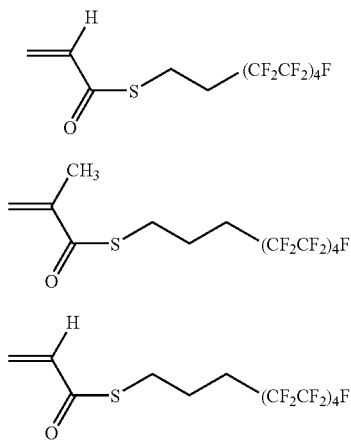

The fluoropolymer preferably is a copolymer of one or more monomers represented by formula (2) with a poly(oxyalkylene) acrylate and/or a poly(oxyalkylene) methacrylate.

The poly(oxyalkylene) group can be represented by $(OR)_x$. R preferably is an alkylene group having 2 to 4 carbon atoms, e.g., —$CH_2CH_2$—, —$CH_2CH_2CH_2$—, —CH($CH_3$)$CH_2$—, or —CH($CH_3$)CH($CH_3$)—.

The oxyalkylene units in the poly(oxyalkylene) group may be the same unit like those in poly(oxypropylene), or may be two or more different kinds of oxyalkylene units irregularly distributed. The oxyalkylene units may also be oxypropylene or oxyethylene units arranged linearly or branch-wise. Furthermore, the group may comprise a linear or branched block made up of oxypropylene units and a linear or branched block made up of oxyethylene units.

This poly(oxyalkylene) chain can include one composed of such poly(oxyalkylene) chains connected to each other by one or more chain-connecting bonds (e.g., —CONH—Ph—NHCO— or —S—; Ph represents a phenylene group). When such chain-connecting bonds include one having a valence of 3 or higher, this provides means for obtaining a branched oxyalkylene unit chain. In the case where this copolymer is to be used in the invention, an appropriate range of the molecular weight of the poly(oxyalkylene) group is from 250 to 3,000.

A poly(oxyalkylene) acrylate or methacrylate can be produced by reacting a commercial hydroxy poly(oxyalkylene) material, e.g., one solid under the trade name of "Pluronic" (manufactured by Asahi Denka Kogyo K.K.), "Adeka Polyether" (manufactured by Asahi Denka Kogyo K.K.), "Carbowax" (manufactured by Glico Products), "Toriton" (manufactured by Rohm and Hass), and P.E.G. (manufactured by Dai-ichi Kogyo Seiyaku Co., Ltd.), with acrylic acid, methacrylic acid, acryloyl chloride, methacryloyl chloride, acrylic anhydride, or the like by a known method. Alternatively, a poly(oxyalkylene) diacrylate or the like produced by a known method can be used.

A preferred poly(oxyalkylene) (meth)acrylate for use as an ingredient to be copolymerized is poly(oxyethylene) (meth)acrylate, because use of this ingredient improves solubility in developing solutions.

In an especially preferred embodiment, the fluoropolymer is a polymer obtained by copolymerizing three or more monomers, i.e., at least one monomer represented by formula (2), poly(oxyethylene) (meth)acrylate, and at least one poly(oxyalkylene) (meth)acrylate. This poly(oxyalkylene) (meth)acrylate is a monomer different from poly(oxyethylene) (meth)acrylate.

More preferably, the fluoropolymer is a terpolymer formed from poly(oxyethylene) (meth)acrylate, poly(oxypropylene) (meth)acrylate, and a monomer represented by formula (2).

The proportion of the poly(oxyethylene) (meth)acrylate to be copolymerized is preferably from 0.5 to 20% by mole, more preferably from 1 to 10% by mole, based on all monomers.

The fluoropolymer preferably further contains comonomer units derived from a monomer represented by the following formula (2b). Formula (2b)

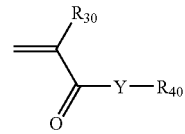

(2b)

In formula (2b), $R_{30}$ represents a hydrogen atom or a methyl group, Y represents a bivalent connecting group, and $R_{40}$ represents a linear, branched, or cyclic alkyl group which has 4 to 20 carbon atoms and may have one or more substituents.

In formula (2b), $R_{30}$ represents a hydrogen atom or a methyl group, and Y represents a bivalent connecting group. The bivalent connecting group preferably is an oxygen atom, sulfur atom, —N($R_{50}$)—, or the like, wherein $R_{50}$ preferably is a hydrogen atom or an alkyl group having 1 to 4 carbon atoms, e.g., methyl group, ethyl group, propyl group, or butyl group. More preferably, $R_{50}$ is a hydrogen atom or methyl group.

Y more preferably is an oxygen atom, —N(H)—, or —N($CH_3$)—.

$R_{40}$ represents a linear, branched, or cyclic alkyl group which has 4 to 20 carbon atoms and may have one or more substituents. Examples of the substituents of the alkyl group represented by $R_{40}$ include hydroxyl, alkylcarboxyl groups, arylcarbonyl groups, carboxyl, alkylether groups, arylether groups, halogen atoms such as fluorine atom, chlorine atom, and bromine atom, nitro atom, cyano group, and amino group. However, the substituents should not be construed as being limited to these examples. Preferred examples of the linear, branched, or cyclic alkyl group having 4 to 20 carbon atoms include linear or branched alkyl groups such as butyl, pentyl group, hexyl group, heptyl group, octyl group, nonyl group, decyl group, undecyl group, dodecyl group, tridecyl group, tetradecyl group, pentadecyl group, octadecyl group, and eicosanyl group, monocyclic alkyl groups such as cyclohexyl group and cycloheptyl group, and polycyclic alkyl groups such as bicycloheptyl group, bicyclodecyl group, tricycloundecyl group, tetracyclododecyl group, adamantly group, norbornyl group, and tetracyclodecyl group.

Specific examples of the monomer represented by formula (2b) include the following monomers, but these examples should not be construed as limiting the monomer of formula (2b).

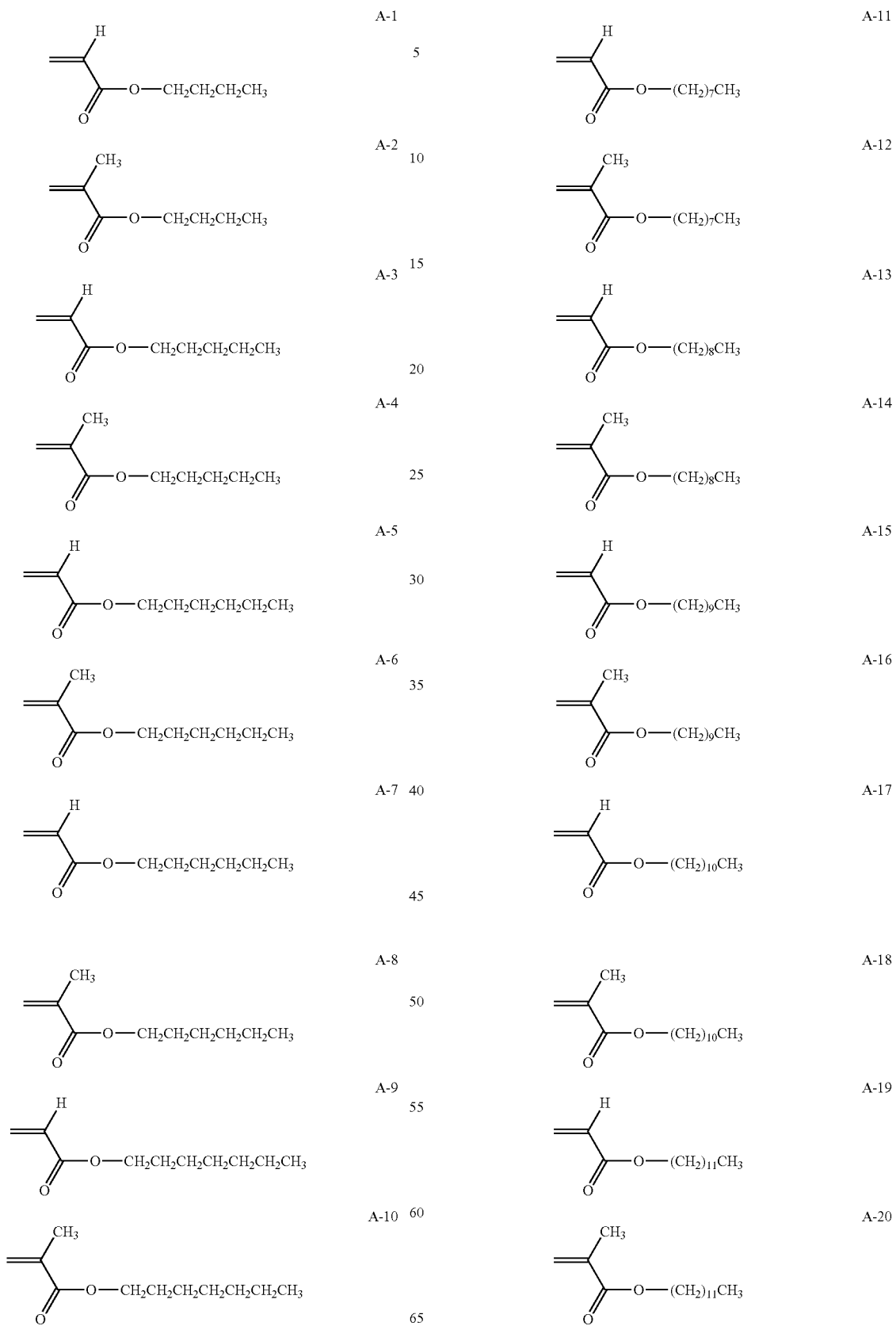

-continued
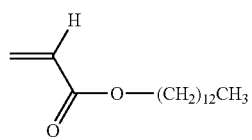
A-21
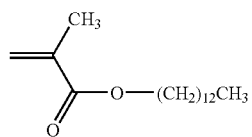
A-22
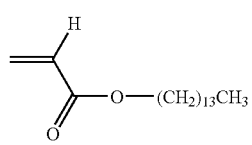
A-23
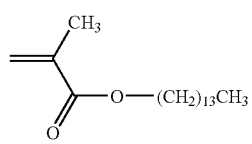
A-24
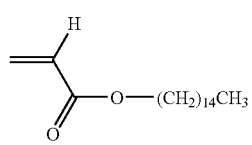
A-25
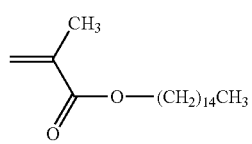
A-26
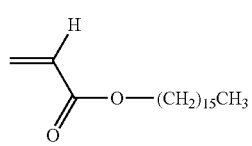
A-27
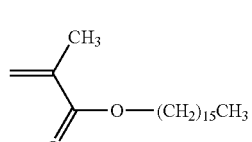
A-28
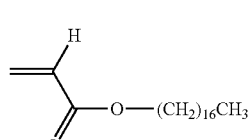
A-29
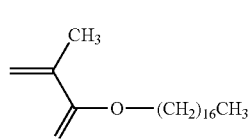
A-30
-continued
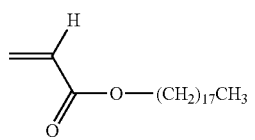
A-31
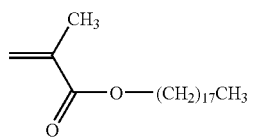
A-32
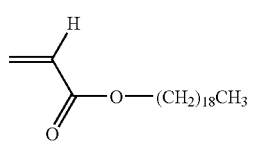
A-33
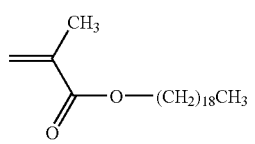
A-34
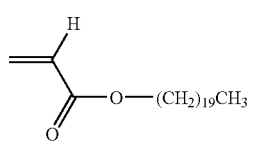
A-35
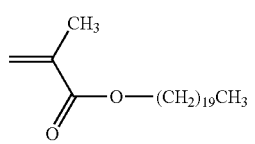
A-36
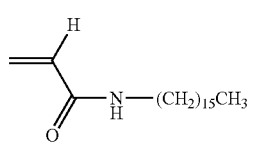
A-37
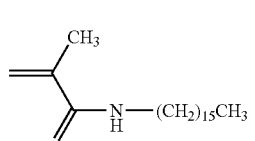
A-38
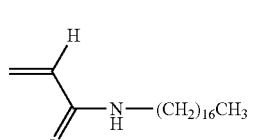
A-39
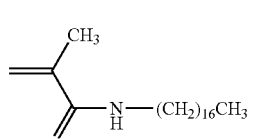
A-40

| | |
|---|---|
| A-41: N-methyl-N-octylacrylamide | A-51: N-butyl-N-octylacrylamide |
| A-42: N-methyl-N-octylmethacrylamide | A-52: N-butyl-N-octylmethacrylamide |
| A-43: N-methyl-N-nonylacrylamide | A-53: N-butyl-N-nonylacrylamide |
| A-44: N-methyl-N-nonylmethacrylamide | A-54: N-propyl-N-nonylmethacrylamide |
| A-45: N-methyl-N-decylacrylamide | A-55: N-propyl-N-decylacrylamide |
| A-46: N-methyl-N-decylmethacrylamide | A-56: N-ethyl-N-decylmethacrylamide |
| A-47: N-methyl-N-undecylacrylamide | A-57: N-ethyl-N-undecylacrylamide |
| A-48: N-methyl-N-undecylmethacrylamide | A-58: N-ethyl-N-undecylmethacrylamide |
| A-49: N-H-N-dodecylacrylamide | A-59: N-methyl-N-dodecylacrylamide |
| A-50: N-H-N-dodecylmethacrylamide | A-60: N-methyl-N-dodecylmethacrylamide |

-continued
A-61
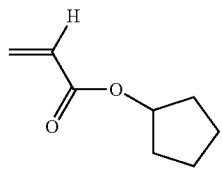
A-62
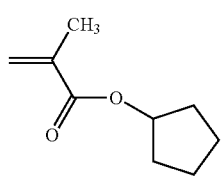
A-63
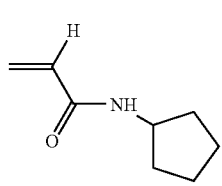
A-64
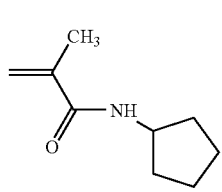
A-65
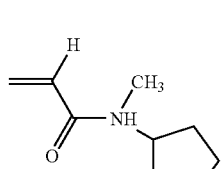
A-66
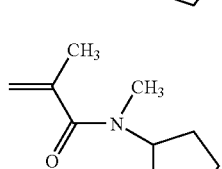
A-67
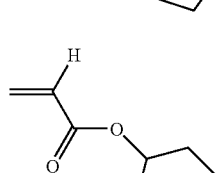
A-68
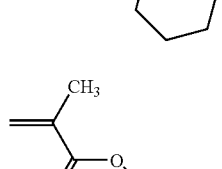
-continued
A-69
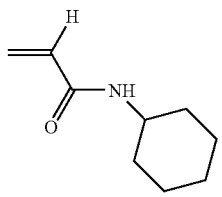
A-70
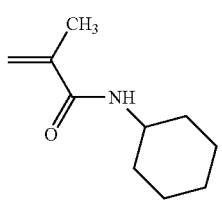
A-71
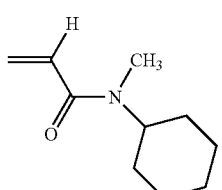
A-72
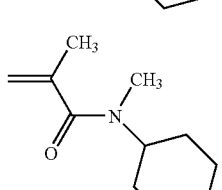
A-73
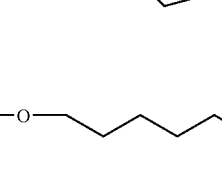
A-74
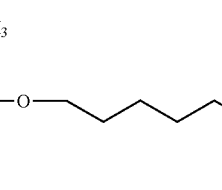
A-75
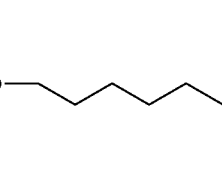
A-76
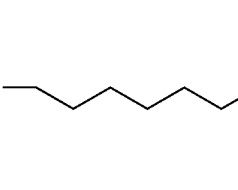
A-77
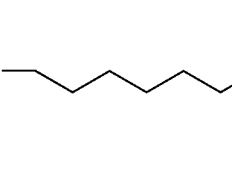

-continued

A-78
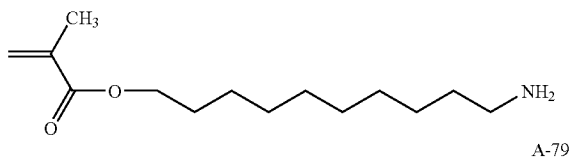

A-79
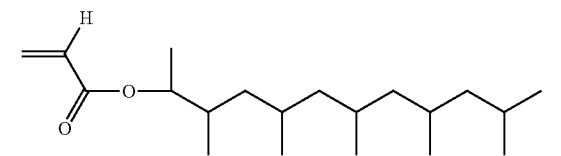

A-80
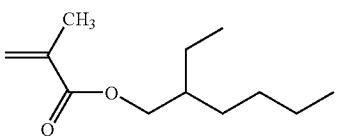

A-81
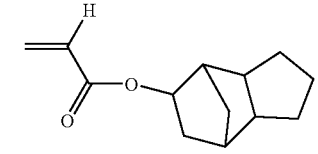

A-82
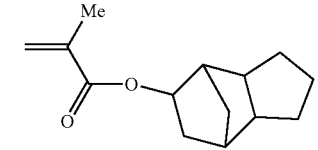

Besides a poly(oxyalkylene) acrylate and/or a poly(oxyalkylene) methacrylate, which are preferred ingredients, and besides the monomer represented by formula (2b), monomers copolymerizable with these can be reacted.

The proportion of these copolymerizable monomers to be copolymerized may be up to 20% by mole, preferably up to 10% by mole, based on all monomers.

As these monomers can be used ones described in *Polymer Handbook*, 2nd, ed., J. Brandrup, Wiley Interscience (1975), Chapter 2, pp. 1–483.

Examples thereof include compounds having one addition-polymerizable unsaturated bond, such as acrylic acid, methacrylic acid, acrylic esters, methacrylic esters, acrylamide and derivatives thereof, methacrylamide and derivatives thereof, allyl compounds, vinyl ethers, and vinyl esters.

Specific examples of those monomers include the following.

Acrylic Esters:

Methyl acrylate, ethyl acrylate, propyl acrylate, chloroethyl acrylate, 2-hydroxyethyl acrylate, trimethylolpropane monoacrylate, benzyl acrylate, methoxybenzyl acrylate, furfuryl acrylate, and tetrahydrofurfuryl acrylate.

Methacrylic Esters:

Methyl methacrylate, ethyl methacrylate, propyl methacrylate, chloroethyl methacrylate, 2-hydroxyethyl methacrylate, trimethylolpropane monomethacrylate, benzyl methacrylate, methoxybenzyl methacrylate, furfuryl methacrylate, and tetrahydrofurfuryl methacrylate.

Acrylamide and Derivatives:

Acrylamide, N-alkylacrylamides (the alkyl is one having 1 to 3 carbon atoms, e.g., methyl, ethyl, or propyl), N,N-dialkylacrylamides (the alkyls each are one having 1 to 3 carbon atoms), N-hydroxyethyl-N-methylacrylamide, and N-2-acetamidoethyl-N-acetylacrylamide.

Methacrylamide and Derivatives:

Methacrylamide, N-alkylmethacrylamides (the alkyl is one having 1 to 3 carbon atoms, e.g., methyl, ethyl, or propyl), N,N-dialkylmethacrylamides (the alkyls each are one having 1 to 3 carbon atoms), N-hydroxyethyl-N-methylmethacrylamide, and N-2-acetamidoethyl-N-acetylmethacrylamide.

Allyl Compounds:

Allyl esters (e.g., allyl acetate, allyl caproate, allyl caprate, allyl laurate, allyl palmitate, allyl stearate, allyl benzoate, allyl acetoacetate, and allyl lactate) and allyloxyethanol.

Vinyl Ethers:

Alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, and butylaminoethyl vinyl ether, benzyl vinyl ether, and tetrahydrofurfuryl vinyl ether).

Vinyl Esters:

Vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl lactate, vinyl β-phenylbutyrate, and vinyl cyclohexanecarboxylate.

Dialkyl Itaconates:

Dimethyl itaconate, diethyl itaconate, and dibutyl itaconate.

Dialkyl Esters or Monoalkyl Esters of Fumaric Acid:

Dibutyl fumarate.

Other monomers such as crotonic acid, itaconic acid, acrylonitrile, methacrylonitrile, maleonitrile, and styrene.

Incidentally, part of the fluorochemicals produced by the electrolytic fluorination process, which have been frequently used hitherto, are lowly biodegradable substances highly apt to accumulate in the living body. There are fears about toxicity of these fluorochemicals to reproduction and growth although the degree of the toxicity is low. An industrial advantage of the fluorochemical according to the invention is that it is a substance safer for the environment.

The amount of those fluoroaliphatic-group-containing monomers represented by formula (2) to be incorporated in the fluoropolymer for use in the invention is generally 5% by mole or larger, preferably from 5 to 70% by mole, more preferably from 7 to 60% by mole, based on all monomers for the fluoropolymer.

The amount of the poly(oxyalkylene) acrylate and/or poly(oxyalkylene) methacrylate which is a preferred ingredient in the invention is generally 10% by mole or larger, preferably from 15 to 70% by mole, more preferably from 20 to 60% by mole, based on all monomers for the fluoropolymer.

The amount of the monomer represented by formula (2b) to be used for a preferred embodiment of the fluoropolymer for use in the invention is generally 3% by mole or larger, preferably from 5 to 50% by mole, more preferably from 10 to 40% by mole, based on all monomers for the fluoropolymer.

The weight-average molecular weight of the fluoropolymer to be used in the invention is preferably from 3,000 to 100,000, more preferably from 6,000 to 80,000.

The fluoropolymer to be used in the invention is added preferably in an amount in the range of from 0.001 to 10% by weight, preferably from 0.001 to 5% by weight, more preferably from 0.01 to 2% by weight, especially preferably from 0.01 to 1% by weight, based on the photosensitive composition (coating ingredients excluding the solvent).

The fluoropolymer according to the invention can be produced by a known or common method. For example, the polymer can be produced by polymerizing monomers such as, e.g., a (meth) acrylate having any of the aforementioned fluoroaliphatic groups and a (meth)acrylate having a poly (oxyalkylene) group in an organic solvent with the aid of a general-purpose free-radical polymerization initiator. Alternatively, one or more other addition-polymerizable unsaturated compounds also may be added according to need to conduct polymerization in the same manner as described above to produce the target polymer. The dropping polymerization method in which monomers are polymerized while dropping the monomers and an initiator into a reaction vessel according to the polymerizability of each monomer is effective in obtaining a polymer having an even composition.

Examples of the structure of the fluoropolymer according to the invention are shown below, but the fluoropolymer should not be construed as being limited to these examples. In each formula, the numeral suffixed to each monomer unit indicates the molar proportion of the unit. Mw represents weight-average molecular weight.

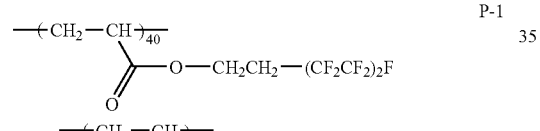

P-1

Mw 15,000

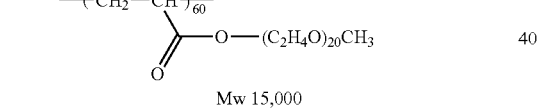

P-2

Mw 15,000

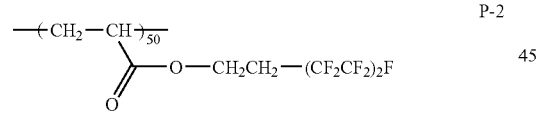

P-3

Mw 8,000

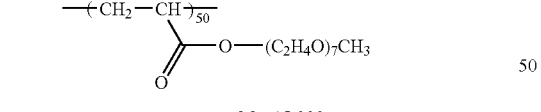

P-4

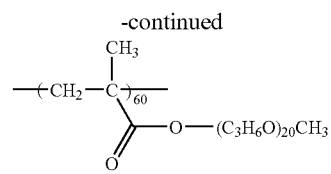

-continued

Mw 30,000

P-5

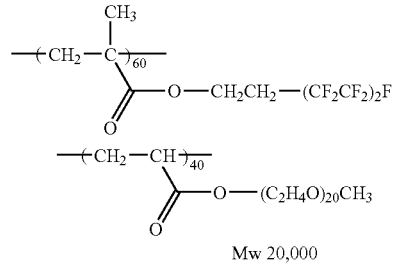

Mw 20,000

P-6

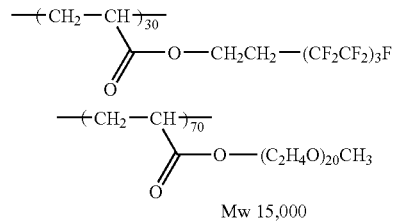

Mw 15,000

P-7

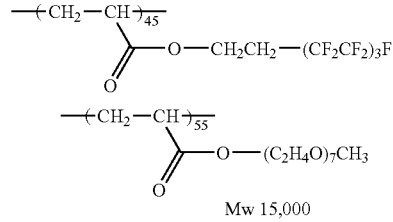

Mw 15,000

P-8

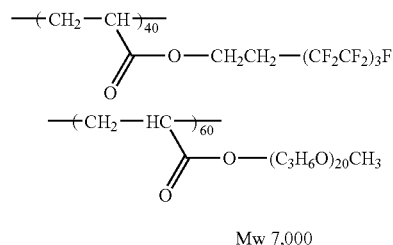

Mw 7,000

P-9

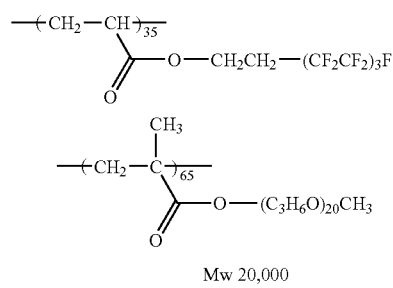

Mw 20,000

P-10

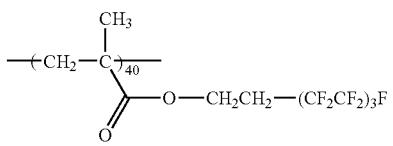

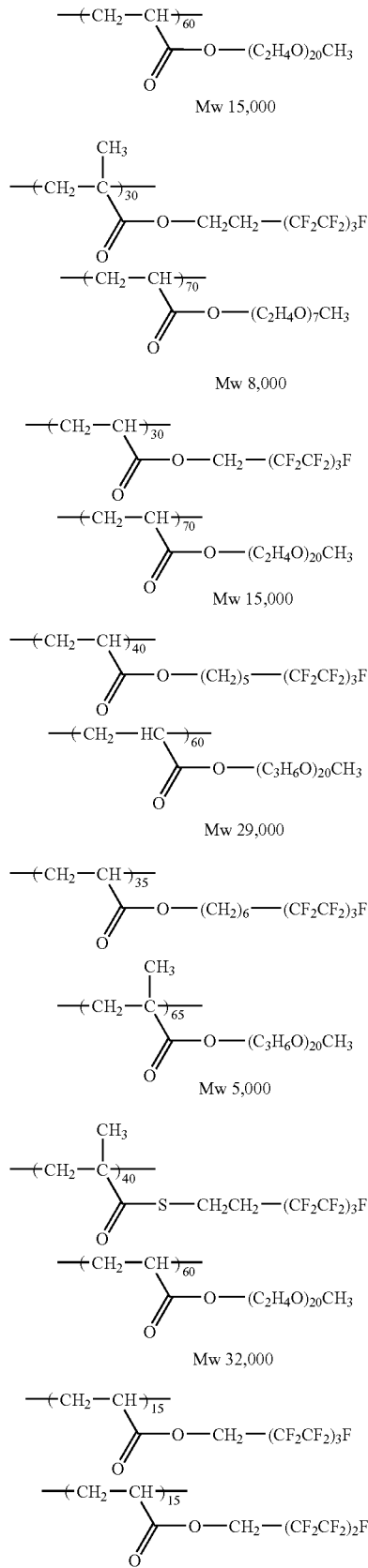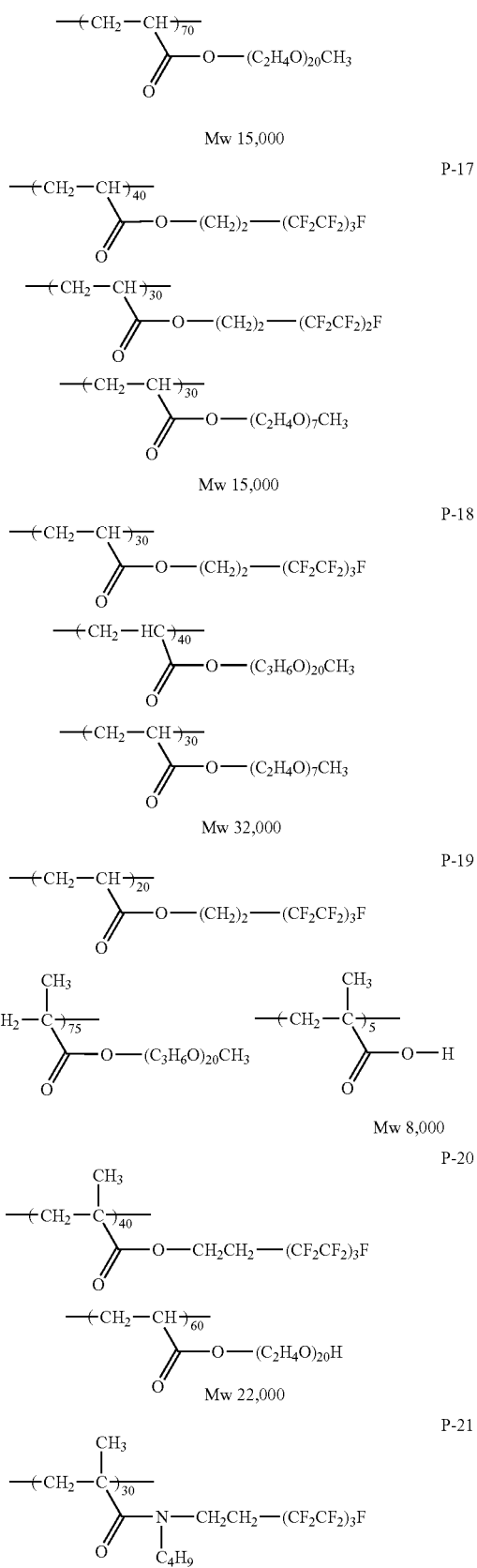

-continued
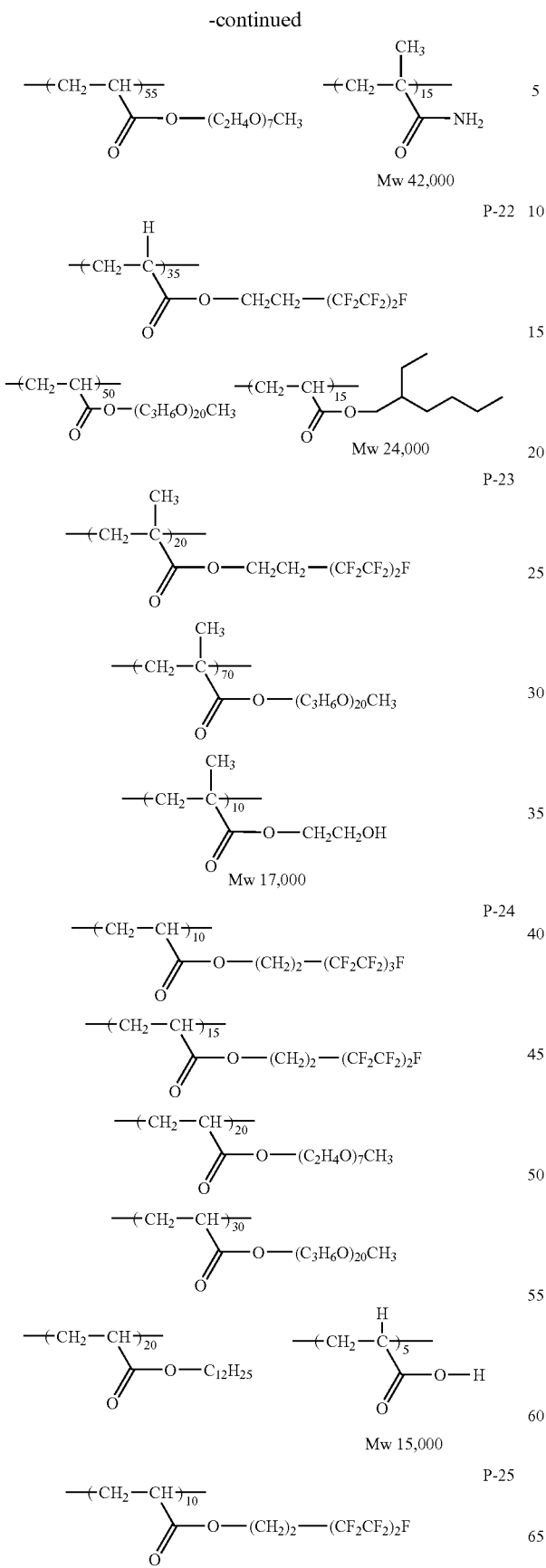
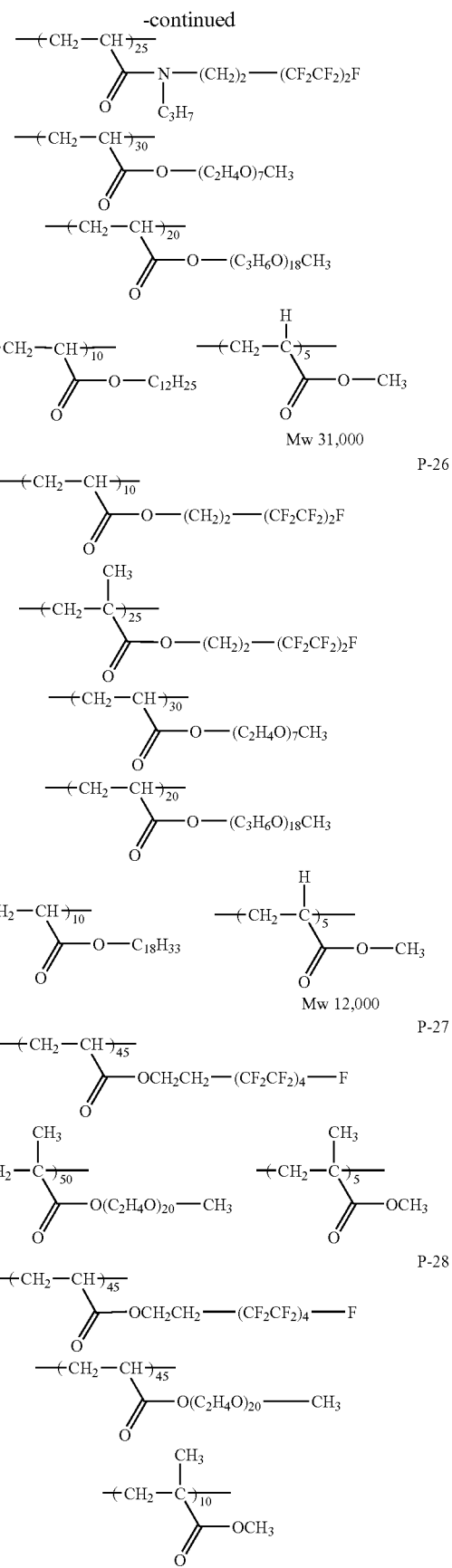

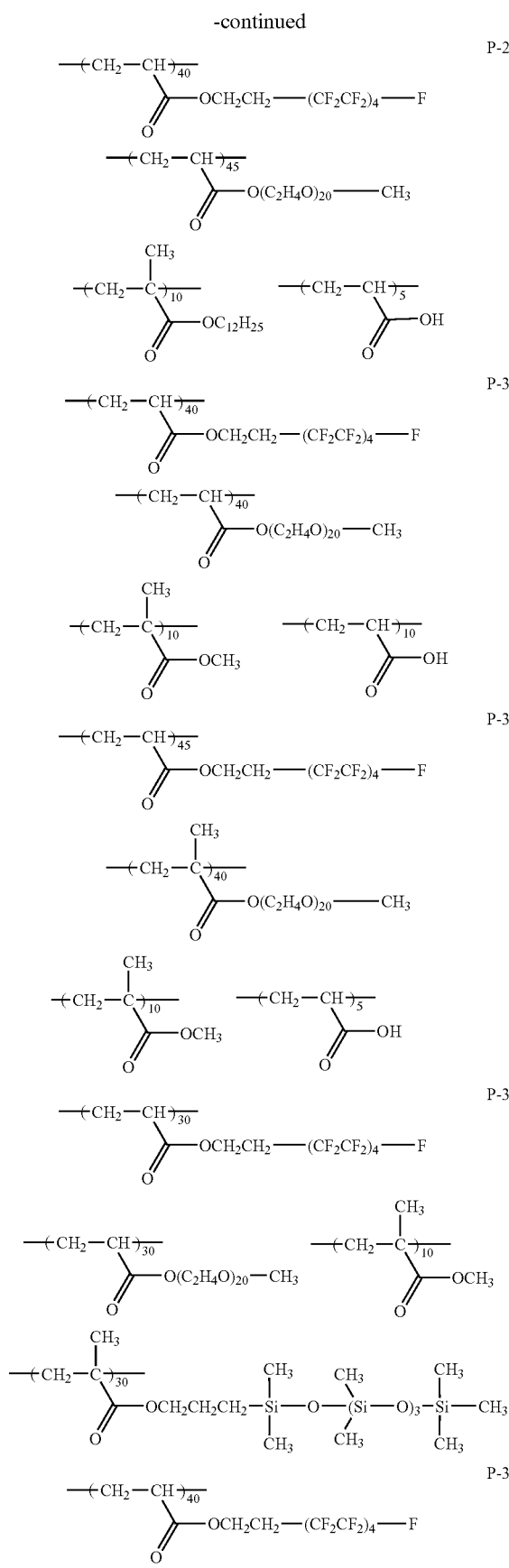
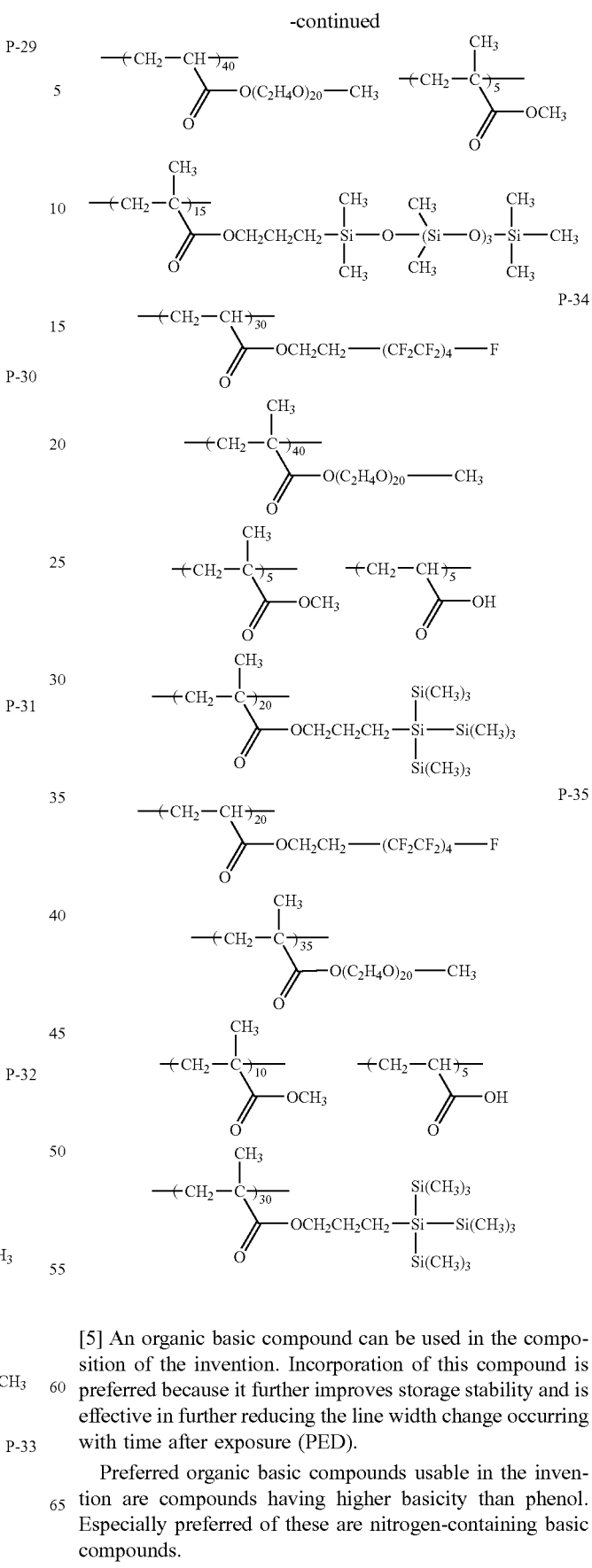

[5] An organic basic compound can be used in the composition of the invention. Incorporation of this compound is preferred because it further improves storage stability and is effective in further reducing the line width change occurring with time after exposure (PED).

Preferred organic basic compounds usable in the invention are compounds having higher basicity than phenol. Especially preferred of these are nitrogen-containing basic compounds.

Examples of preferred chemical environments include the following structures (A) to (E).

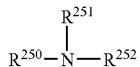
(A)

In formula (A), $R^{250}$, $R^{251}$, and $R^{252}$ may be the same or different and each is a hydrogen atom, an alkyl group having 1 to 10 carbon atoms, an aminoalkyl group having 1 to 10 carbon atoms, a hydroxyalkyl group having 1 to 10 carbon atoms, or a substituted or unsubstituted aryl group having 6 to 20 carbon atoms, provided that $R^{251}$ and $R^{252}$ may be bonded to each other to form a ring.

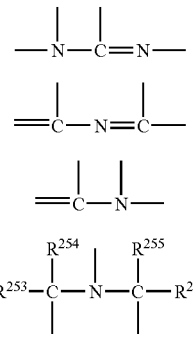

In formula (E), $R^{253}$, $R^{254}$, $R^{255}$, and $R^{256}$ may be the same or different and each represents an alkyl group having 1 to 6 carbon atoms.

More preferred compounds are cycloalkylamines containing one or more cycloalkyl groups, nitrogen-containing cyclic compounds (referred to also as cyclic amine compounds), and nitrogen-containing basic compounds having per molecule two or more nitrogen atoms differing in chemical environment.

Preferred examples of the cycloalkylamines containing a cycloalkyl group include cyclopropylamine, cyclobutylamine, cyclopentylamine, dicyclopentylamine, dicyclopentylmethylamine, dicyclopentylethylamine, cyclohexylamine, dimethylcyclohexylamine, dicyclohexylamine, dicyclohexylmethylamine, dicyclohexylethylamine, dicyclohexylbutylamine, cyclohexyl-t-butylamine, cycloheptylamine, cyclooctylamine, 1-adamantanamine, 1-dimethylaminoadamantane, 1-diethylaminoadamantane, 2-adamantanamine, 2-dimethylaminoadamantane, 2-aminonorbornene, and 3-noradamantanamine.

The cyclic amine compounds more preferably are ones having a polycyclic structure. Preferred examples of the cyclic amine compounds include compounds represented by the following formula (F).

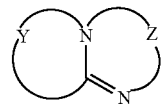
(F)

In formula (F), Y and Z each independently represents a linear, branched, or cyclic alkylene group which may contain one or more heteroatoms and may be substituted.

Examples of the heteroatoms include nitrogen, sulfur, and oxygen atoms. The alkylene group is one having preferably 2 to 10, more preferably 2 to 5 carbon atoms. Examples of the substituents of the alkylene group include alkyl group having 1 to 6 carbon atoms, aryl groups, alkenyl groups, halogen atoms, and halogen-substituted alkyl groups. Specific examples of the compounds represented by formula (F) include the following compounds.

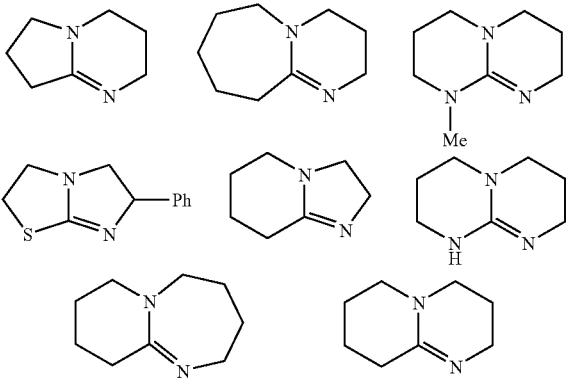

Especially preferred of these are 1,8-diazabicyclo[5.4.0]undec-7-ene and 1,5-diazabicyclo[4.3.0]non-5-ene.

The nitrogen-containing basic compounds having per molecule two or more nitrogen atoms differing in chemical environment especially preferably are compounds containing both a substituted or unsubstituted amino group and a cyclic structure containing one or more nitrogen atoms or are compounds having an alkylamino group. Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents are amino, aminoalkyl groups, alkylamino groups, aminoaryl groups, arylamino groups, alkyl groups, alkoxy groups, acyl groups, acyloxy groups, aryl groups, aryloxy groups, nitro group, hydroxy group, and cyano group.

Especially preferred examples of these compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. However, the basic compounds should not be construed as being limited to these examples.

Those nitrogen-containing basic compounds may be used alone or in combination of two or more thereof. The amount of the nitrogen-containing basic compounds to be used is generally from 0.001 to 10 parts by weight, preferably from 0.01 to 5 parts by weight, based on 100 parts by weight of the positive photoresist composition (excluding the solvent).

In case where the amount of the nitrogen-containing basic compounds used is smaller than 0.001 part by weight, the effects described above cannot be obtained. On the other hand, amounts thereof exceeding 10 parts by weight tend to result in reduced sensitivity and impaired suitability for development of unexposed areas.

A surfactant, dye, pigment, plasticizer, photosensitizer, compound having two or more phenolic OH groups which enhances solubility in developing solutions, and the like can be incorporated into the chemical amplification type positive photoresist composition of the invention according to need.

The positive photoresist composition of the invention preferably contains a surfactant.

Examples of the surfactant include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan fatty acid esters, e.g., sorbitan monolaurate, sorbitan monopalmitate, sorbitan monostearate, sorbitan monoolerate, sorbitan trioleate, and sorbitan tristearate, and polyoxyethylene sorbitan fatty acid esters such as polyoxyethylene sorbitanmonolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, FE303, and EF352 (manufactured by New Akita Chemical Company), Megafac F171, F173, F176, F189, and R08 (manufactured by Dainippon Ink & Chemicals, Inc.), Fluorad FC430 and FC431 (manufactured by Sumitomo 3M Ltd.), and Asahi Guard AG710 and Surflon S-382, SC101, SC102, SC103, SC104, SC105, and SC106 (manufactured by Asahi Glass Co., Ltd.); and other surfactants such as organosiloxane polymer KP341 (manufactured by Shin-Etsu Chemical Co., Ltd.), acrylic or methacrylic (co)polymers Polyflow No. 75 and No. 95 (manufactured by Kyoeisha Chemical Co., Ltd.), and Troy Sol S-366 (manufactured by Troy Chemical Co., Ltd.).

Preferred of those surfactants are the fluorochemical or silicone surfactants from the standpoints of applicability and diminution of development defects.

The amount of the surfactant to be incorporated is generally from 0.01 to 2% by weight, preferably from 0.01 to 1% by weight, based on all solid components of the composition of the invention.

Those surfactants can be used alone or in combination of two or more thereof.

A spectral sensitizer such as those shown below may be further added so that the photo-acid generator(s) used can be sensitive in a region of wavelengths which are longer than those of far ultraviolet and at which the photo-acid generators show no absorption. Thus, the chemical amplification type positive resist of the invention can be made sensitive to i- or g-line.

Preferred examples of the spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavine T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizer should not be construed as being limited to these examples.

Examples of the compound having two or more phenolic OH groups which enhances solubility in developing solutions include polyhydroxy compounds. Preferred examples of the polyhydroxy compounds include phenols, resorcinol, phloroglucinol, phloroglucide, 2,3,4-trihydroxybenzophenone, 2,3,4,4'-tetrahydroxybenzophenone, α,α',α''-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)cyclohexane.

When the chemical amplification type positive photoresist composition of the invention is used, the ingredients described above are dissolved in a solvent therefor and the resultant solution is applied to a substrate. Preferred examples of usable solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

The chemical amplification type positive photoresist composition is applied to a substrate, such as ones for use in producing precision integrated-circuit elements (e.g., silicon/silicon dioxide coating), by an appropriate coating technique with, e.g., a spinner or coater. The resultant coating film is exposed to light through a given mask, subsequently baked, and then developed. Thus, a satisfactory resist pattern can be obtained.

Examples of developing solutions for the chemical amplification type positive photoresist composition of the invention include aqueous solutions (usually from 0.1 to 10% by weight solutions) of alkalis such as inorganic alkalis, e.g., sodium hydroxide, potassium hydroxide, sodium carbonate, sodium silicate, sodium phosphate, sodium metasilicate, and ammonia water, primary amines, e.g., ethylamine and n-propylamine, secondary amines, e.g., diethylamine and di-n-butylamine, tertiary amines e.g., triethylamine and methyldiethylamine, alcoholamines, e.g., dimethylethanolamine and triethanolamine, amides, e.g., formamide and acetamide, quaternary ammonium salts, e.g., tetramethylammonium hydroxide, trimethyl(2-hydroxyethyl)ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide, and tetrabutylammonium hydroxide, and cyclic amines, e.g., pyrrole and piperidine.

EXAMPLES

The invention will be explained below in greater detail by reference to the following Examples, but the invention should not be construed as being limited to these Examples.

Synthesis Example 1

Resin Synthesis Example

Resin synthesis can be accomplished either by a method using a vinyl ether for acetalization or by an acetal interchange method using an alcohol and an alkyl vinyl ether.

Furthermore, a dehydrating azeotropic method such as those shown below can be advantageously used for efficient stable synthesis. However, these synthesis methods are mere examples, and methods usable for synthesizing the resin according to the invention should not be construed as being limited thereto.

(1) (Synthesis of Resin 1)

VP 8000 (1,800 g), manufactured by Nippon Soda Co., Ltd., was mixed with propylene glycol monomethyl ether acetate (PGMEA) (8,200 g) in a flask to obtain a solution. This solution was distilled under reduced pressure to remove water and PGMEA through azeotropy.

After the water content was ascertained to have decreased sufficiently, a solution prepared by dissolving pyridinium p-toluenesulfonate (9.0 g) in cyclohexaneethanol (576.2 g) was added to the reaction mixture. t-Butyl vinyl ether (450.2 g) was further added thereto and the resultant mixture was stirred at room temperature for 5 hours.

To this reaction mixture were added water (3.6 L) and ethyl acetate (7.2 L). The resultant mixture was subjected to liquid separation, washing with water, and then vacuum distillation to remove the ethyl acetate, water, and PGMEA as an azeotrope component. Thus, an alkali-soluble resin having substituents according to the invention (resin 1) (30% PGMEA solution) was obtained.

GPC in terms of standard polystyrene revealed that the Mw of the polymer obtained was 11,000 and Mw/Mn therefor was 1.10.

(2) (Synthesis of Resin 2)

VP 15000 (100 g), manufactured by Nippon Soda Co., Ltd., was mixed with propylene glycol monomethyl ether acetate (PGMEA) (400 g) in a flask to obtain a solution. This solution was distilled under reduced pressure to remove water and PGMEA through azeotropy.

After the water content was ascertained to have decreased sufficiently, ethyl vinyl ether (25.0 g) and p-toluenesulfonic acid (0.02 g) were added to the reaction mixture and this mixture was stirred at room temperature for 1 hour.

Triethylamine (0.03 g) was added to the reaction mixture to terminate the reaction. Water (400 mL) and ethyl acetate (800 mL) were added thereto. The resultant mixture was subjected to liquid separation, washing with water, and then vacuum distillation to remove the ethyl acetate, water, and PGMEA as an azeotrope component. Thus, an alkali-soluble resin having substituents according to the invention (resin 2) (30% PGMEA solution) was obtained.

GPC in terms of standard polystyrene revealed that the Mw of the polymer obtained was 18,000 and Mw/Mn therefor was 1.12.

(3) (Synthesis of Resin 3)

In 100 mL of acetone were dissolved 16.2 g of poly(p-hydroxystyrene) and isopropyl chloride. To this reaction mixture was added 1.8 g of triethylamine. This mixture was stirred at 50 to 55° C. for 5 hours. The resultant reaction mixture was transferred to 1,000 mL of water, and the upper layer was removed by decantation. The viscous resinous substance obtained was dissolved in 75 mL of acetone, and this solution was transferred to 500 mL of water. The rubbery resin precipitated was dried under vacuum. Thus, 15.4 g of poly(p-hydroxystyrene/p-isopropoxystyrene) was obtained as a white powder.

The proportion of the p-hydroxystyrene repeating units to p-isopropoxystyrene repeating units in the polymer obtained was found to be 90:10 through $^1$H-NMR spectroscopy. Furthermore, GPC in terms of standard polystyrene revealed that the weight-average molecular weight Mw of the polymer obtained was 15,500 and molecular-weight distribution Mw/Mn therefor was 1.12.

In 150 mL of ethyl acetate were dissolved 15.0 g of the poly(p-hydroxystyrene/p-isopropoxystyrene) and 3.0 g of ethyl vinyl ether. A catalytic amount of p-toluenesulfonic acid was added thereto. The resultant mixture was stirred at room temperature for 6 hours to allow a reaction to proceed.

After the reaction, the product of synthesis was neutralized with triethylamine and concentrated. The resultant viscous oily residue was dissolved in 100 mL of acetone. This solution was transferred to 3,000 mL of water in order to cause precipitation.

The polymer precipitated was taken out by filtration, washed with water, and vacuum-dried. Thus, 16.2 g of poly(p-1-ethoxyethoxystyrene/p-hydroxystyrene/p-isopropoxys tyrene) was obtained as a white powder.

The proportion of the p-1-ethoxyethoxystyrene repeating units to p-hydroxystyrene repeating units to p-isopropoxystyrene repeating units in the polymer obtained was found to be 30:60:10 through $^1$H-NMR spectroscopy. Furthermore, GPC in terms of standard polystyrene revealed that the Mw of the polymer obtained was 18,000 and Mw/Mn therefor was 1.12.

(4) (Synthesis of Resin 4)

Synthesis Example 4-1: Synthesis of Vinyl Ether

Cyclohexylethyl alcohol was mixed with ethyl vinyl ether. Mercury acetate was added thereto and this mixture was stirred at room temperature for 12 hours. The resultant reaction mixture was extracted with ethyl acetate and water, and the extract was washed with water and then distilled under reduced pressure to obtain cyclohexylethyl vinyl ether (X-1) as the target compound.

Synthesis Example 4-2

In 100 mL of tetrahydrofuran were dissolved 39.6 g (0.225 mol) of p-tert-butoxystyrene monomer and 4 g (0.025 mol) of t-butylstyrene monomer which each had been dehydrated and distillation-purified in an ordinary manner. In a nitrogen stream, 0.033 g of azobisisobutyronitrile (AIBN) was added thereto with stirring at 80° C. three times at an interval of 2.5 hours. After the final addition, the reaction mixture was continuously stirred for further 5 hours to conduct polymerization reaction. The resultant reaction mixture was poured into 1,200 mL of hexane to precipitate a white resin. The resin obtained was dried and then dissolved in 150 mL of tetrahydrofuran.

Thereto was added 4 N hydrochloric acid. The resultant mixture was heated with refluxing for 6 hours to hydrolyze the resin. This resin was reprecipitated from 5 L of ultrapure water, taken out by filtration, washed with water, and then dried. Furthermore, this resin was dissolved in 200 mL of tetrahydrofuran and the resultant solution was dropped into 5 L of ultrapure water with vigorous agitation to conduct reprecipitation. This reprecipitation operation was repeated three times. The resin obtained was dried in a vacuum dryer at 120° C. for 12 hours. Thus, an alkali-soluble poly (p-hydroxystyrene/t-butylstyrene) copolymer resin R-2 was obtained.

The resin obtained had a weight-average molecular weight of 9,600.

Synthesis Example 4-3

The following ingredients were mixed together in a flask to obtain a solution.

| | |
|---|---|
| Alkali-soluble resin R-2 obtained in Synthesis Example 4-2 | 20 g |
| Propylene glycol monomethyl ether acetate (PGMEA) | 80 mL |

This solution was distilled under reduced pressure to remove water and PGMEA through azeotropy.

After the water content was ascertained to have decreased sufficiently, 5.0 g of the vinyl ether X-1 obtained in Synthesis Example 4-1 and 35 mg of p-toluenesulfonic acid were added to the reaction mixture. This mixture was stirred at room temperature for 1 hour, and triethylamine was added thereto to terminate the reaction.

Ethyl acetate was added to the reaction mixture. The resultant mixture was washed with water and then distilled under reduced pressure to remove the ethyl acetate, water, and PGMEA as an azeotrope component. Thus, an alkali-soluble resin having substituents according to the invention (resin 4) was obtained.

The resin obtained had a weight-average molecular weight of 11,000.

The structures of resins 1 to 4 described above are shown below. The proportion of repeating units in each resin shown below is given in molar ratio.

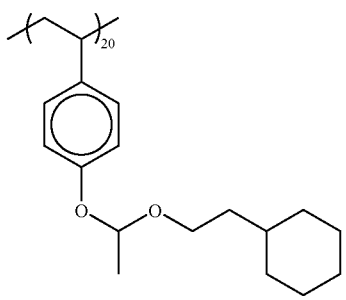

Resin 1

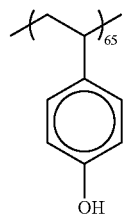

Resin 2

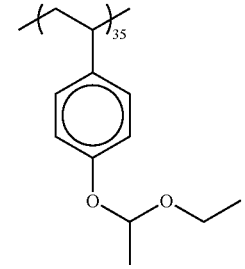

Resin 3

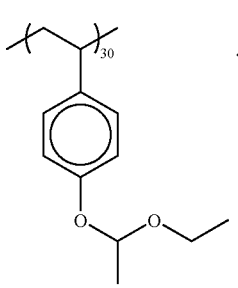

Resin 4

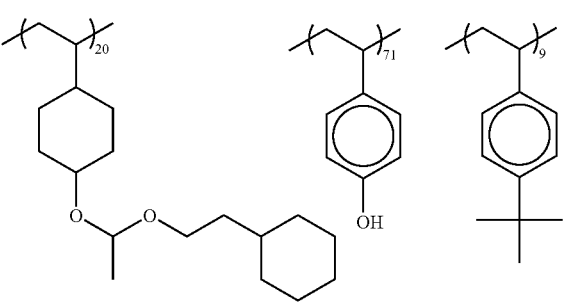

Photo-Acid Generator Synthesis Example (1) (Synthesis of PAG 1)
As PAG 1 was used the compound described in the Example 86 of JP-A-2000-314956.

(2) (Synthesis of PAG 2)
As PAG 2 was used the compound described in the Example 9 of International Patent Publication No. 2000-517067.

(3) Synthesis of Triphenylsulfonium 2,4,6-(Triisopropyl) benzenesulfonate Compound (PAG3)

In 300 mL of methanol was dissolved 17.5 g of triphenylsulfonium iodide. Thereto was added 10.9 g of silver oxide. This reaction mixture was stirred at room temperature for 4 hours and then filtered through a filter.

On the other hand, 14.7 g of 2,4,6-(triisopropyl)benzenesulfonyl chloride was dissolved in a mixture of 100 mL of methanol and 100 mL of water. A 10% methanol solution of tetramethylammonium hydroxide (TMAH) was added dropwise thereto with cooling with ice. The resultant mixture was reacted at 50° C. for further 1 hour and then allowed to cool. Hydrochloric acid was added thereto to make the system acidic. This mixture was added to the reaction mixture obtained above, and the resultant mixture was stirred at room temperature.

Thereafter, the reaction mixture was concentrated and chloroform was added thereto. This mixture was washed with TMAH twice and with water twice, and the resultant residue was concentrated. The solid obtained was recrystallized from diisopropyl ether/ethyl acetate. Thus, 22 g of the target compound (PAG3) was obtained.

Various compounds were obtained in the same manner.

The structures of PAG 1 to PAG 6 described above are shown below.

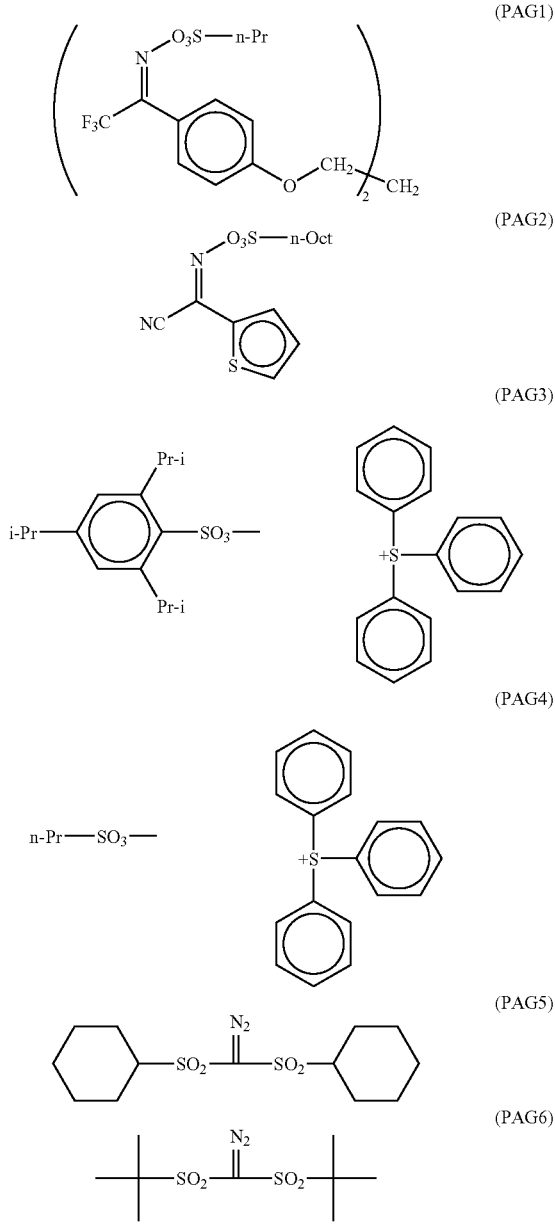

[Synthesis of Fluoroaliphatic-Group-Containing Polymeric Compounds (P-27, 28, 30, 34, and 35 shown above)]

(Synthesis of P-27)

Into a 500-mL glass reactor were introduced 23.3 g of F-66, 49 g of polyethylene monomer PE-1 shown below, 0.5 g of methyl methacrylate, and 0.25 g of dodecyl mercaptan. These ingredients were dissolved in 100 mL of MEK. After the solution was heated to 70° C., 0.3 g of azobisisobuty- ronitrile was added thereto to conduct a copolymerization reaction for 4 hours in a nitrogen atmosphere. Thereafter, 0.1 g of azobisisobutyronitrile was added thereto, and the resultant mixture was heated to 80° C. and reacted for further 4 hours. The resultant reaction mixture was distilled to remove the solvent therefrom and the residue was vacuum-dried. Thus, 70 g of a fluoroaliphatic-group-containing polymeric compound P-27 was obtained.

P-28, P-30, P-34, and P-35 were synthesized in the same manner as for P-27, except that the monomers shown in Table 1 were reacted in the respective amounts shown therein.

TABLE 1

| | Monomer 1 | Monomer 2 | Monomer 3 | Monomer 4 | Monomer 5 |
|---|---|---|---|---|---|
| P-28 | F-66 23.3 g | PE-2 43.5 g | methyl methacrylate 1.0 g | | |
| P-30 | F-66 20.7 g | PE-2 38.7 g | methyl methacrylate 1.0 g | acrylic acid 0.72 g | |
| P-34 | F-66 15.5 g | PE-1 39.2 g | methyl methacrylate 0.5 g | acrylic acid 0.36 g | SI-1 7.2 g |
| P-35 | F-66 10.4 g | PE-1 34.4 g | methyl methacrylate 1.0 g | acrylic acid 0.36 g | SI-1 10.8 g |

$$CH_2=\underset{\underset{O}{|}}{\overset{\overset{CH_3}{|}}{C}}-O(C_2H_4O)_{20}-CH_3$$

PE-1

$$CH_2=CH-\underset{\underset{O}{|}}{C}-O(C_2H_4O)_{20}-CH_3$$

PE-2

$$CH_2=\underset{\underset{O}{|}}{\overset{\overset{CH_3}{|}}{C}}-OCH_2CH_2CH_2-\underset{\underset{Si(CH_3)_3}{|}}{\overset{\overset{Si(CH_3)_3}{|}}{Si}}-Si(CH_3)_3$$

SI-1

In propylene glycol monomethyl ether acetate (PGMEA solvent) were dissolved the ingredients shown in Table 2 or 3 in the weight ratio shown in the table so that the total concentration resulted in 12% by weight. The solution was filtered through a 0.1-μm microfilter to prepare a positive photoresist fluid.

Each resist fluid obtained was applied with a spin coater (Mark 8, manufactured by Tokyo Electron) to a silicon wafer on which a 110-nm coating film had been formed from an organic BARC (DUV 42) manufactured by Nissan Chemical Industries, Ltd. The resist fluid applied was dried at 90° C. for 90 seconds to form a 0.5-μm resist film for evaluation.

(Method of Development Defect Evaluation)

Without being patterned, each resist film for evaluation was heat-treated at 110° C. for 90 seconds. This film was developed with 2.38% aqueous TMAH solution, subsequently rinsed, and then spin-dried to produce a wafer for development defect evaluation. The number of contaminant particles present on the surface of this wafer was counted with KLA-2113 (manufactured by KLA Corp.). The total particle number obtained by subtracting the number of dust-derived contaminant particles from the particle number counted was taken as the number of development defects.

The following compound was incorporated as an additive in each of the resists obtained in the Examples and Comparative Examples, in an amount of 0.2 parts by weight.

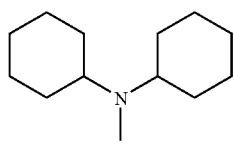

TABLE 2

Examples

| | Resin (B) (parts by weight) | Photo-acid generator (parts by weight) | | | Fluoroaliphatic-group-containing polymeric compound (parts by weight) | Number of development defects |
|---|---|---|---|---|---|---|
| 1 | resin 1 (96.72) | PAG-1 (1.5) | PAG-4 (1.5) | | P-27 (0.08) | 20 |
| 2 | resin 1 (96.72) | PAG-1 (1.5) | PAG-4 (1.5) | | P-35 (0.08) | 27 |
| 3 | resin 2 (96.72) | PAG-1 (2.0) | PAG-3 (1.0) | | P-27 (0.08) | 22 |
| 4 | resin 2 (96.72) | PAG-1 (2.0) | PAG-3 (1.0) | | P-28 (0.08) | 26 |
| 5 | resin 2 (96.72) | PAG-1 (2.0) | PAG-3 (1.0) | | P-30 (0.08) | 33 |
| 6 | resin 2 (96.76) | PAG-1 (2.0) | PAG-3 (1.0) | | P-35 (0.04) | 22 |
| 7 | resin 2 (96.72) | PAG-1 (2.0) | PAG-3 (1.0) | | P-35 (0.08) | 21 |
| 8 | resin 2 (96.64) | PAG-1 (2.0) | PAG-3 (1.0) | | P-35 (0.16) | 20 |
| 9 | resin 2 (95.72) | PAG-1 (1.0) | PAG-3 (1.0) | PAG-5 (2.0) | P-35 (0.08) | 34 |
| 10 | resin 3 (94.72) | PAG-1 (4.0) | PAG-3 (1.0) | | P-34 (0.08) | 16 |
| 11 | resin 4 (95.72) | PAG-1 (1.0) | PAG-3 (1.0) | PAG-5 (2.0) | P-30 (0.10) | 18 |
| 12 | resin 4 (94.8) | PAG-1 (1.0) | PAG-3 (1.0) | PAG-5 (2.0) | P-35 (1.0) | 15 |
| 13 | resin 4 (94.72) | PAG-2 (1.0) | PAG-4 (2.0) | PAG-6 (2.0) | P-34 (0.08) | 29 |
| 14 | resin 4 (93.6) | PAG-2 (1.0) | PAG-4 (2.0) | PAG-6 (2.0) | P-28 (1.2) | 38 |

TABLE 3

Comparative Examples

| | Resin (B) (parts by weight) | Photo-acid generator (parts by weight) | | | Fluoroaliphatic-group-containing polymeric compound (parts by weight) | Number of development defects |
|---|---|---|---|---|---|---|
| 1 | resin 1 (96.72) | PAG-1 (1.5) | PAG-4 (1.5) | | | 202 |
| 2 | resin 1 (96.72) | PAG-1 (1.5) | PAG-4 (1.5) | | | 305 |
| 3 | resin 2 (96.72) | PAG-1 (2.0) | PAG-3 (1.0) | | | 750 |
| 4 | resin 2 (95.72) | PAG-1 (1.0) | PAG-3 (1.0) | PAG-5 (2.0) | | 623 |
| 5 | resin 3 (94.72) | PAG-1 (4.0) | PAG-3 (1.0) | | | 804 |
| 6 | resin 4 (95.72) | PAG-1 (1.0) | PAG-3 (1.0) | PAG-5 (2.0) | | 250 |
| 7 | resin 4 (94.72) | PAG-2 (1.0) | PAG-4 (2.0) | PAG-6 (2.0) | | 286 |

The results given in Tables 2 and 3 clearly show that the compositions according to the invention were exceedingly reduced in development defects.

According to the invention, a positive photoresist composition effective in considerably diminishing development defects can be provided.

What is claimed is:

1. A positive photoresist composition comprising:
   (A) an oxime sulfonate compound represented by the following formula (1),
   (B) a resin comprising repeating units including a group represented by the following formula (X) and which increases the solubility in an alkaline developing solution by the action of an acid, and
   (C) a fluoroaliphatic-group-containing polymeric compound containing repeating units derived from a monomer represented by the following formula (2):

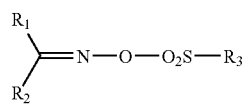

(1)

wherein $R_1$ and $R_2$ each independently represents an alkyl group, an alkenyl group, an alkynyl group, an aryl group, a heterocyclic group, or a cyano group, provided that $R_1$ and $R_2$ may be bonded to each other to form a ring, and $R_3$ represents an alkyl group or an aryl group, and $R_1$ and $R_2$ each may be bonded, through a single bond or a connecting group, to the $R_1$ or $R_2$ of another compound represented by formula (1):

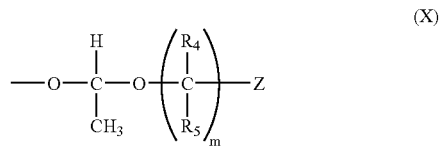

(X)

wherein $R_4$ and $R_5$ each independently represents a hydrogen atom or an alkyl group, Z represents an alkyl group, and m represents an integer of 1 to 20:

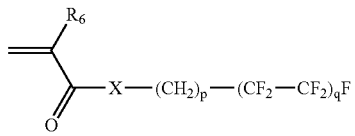

(2)

wherein $R_6$ represents a hydrogen atom or a methyl group, X represents an oxygen atom, a sulfur atom, or —N($R_7$)—, p represents an integer of 1 to 6, and q represents an integer of 2 to 4, provided that $R_7$ represents a hydrogen atom or an alkyl group having 1 to 4 carbon atoms.

2. The composition according to claim 1, further comprising a compound represented by the following formula (3) which is capable of generating an acid upon irradiation with actinic rays or a radiation:

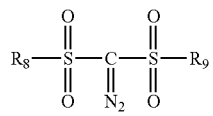

(3)

wherein $R_8$ and $R_9$ each independently represents an alkyl group or an aryl group.

3. The composition according to claim 2, wherein the amount of the compound represented by formula (3) is from 0.01 to 7% by weight based on the solid ingredients in the composition.

4. The composition according to claim 2, wherein the proportion by weight of the compound represented by formula (1) to the compound represented by formula (3) is from 90/10 to 15/85.

5. The composition according to claim 1, wherein the amount of the compound represented by formula (1) is from 0.1 to 10% by weight based on the solid ingredients in the composition.

6. The composition according to claim 1, wherein the content of the repeating units having a group represented by formula (X) is from 5 to 50% by mole based on all repeating units in the component (B).

7. The composition according to claim 1, further comprising an organic basic compound.

8. A method for forming a pattern, which comprises forming a resist film comprising the composition described in claim 1, exposing the resist film upon irradiation with the actinic rays or a radiation, and subsequently developing the resist film.

\* \* \* \* \*